US012578647B2

(12) United States Patent
Park et al.

(10) Patent No.: US 12,578,647 B2
(45) Date of Patent: Mar. 17, 2026

(54) SUBSTRATE ROTATING APPARATUS, SUBSTRATE PROCESSING SYSTEM INCLUDING THE SAME, AND SUBSTRATE PROCESSING METHOD USING THE SAME

(71) Applicant: Samsung Electronics Co., Ltd., Suwon-si (KR)

(72) Inventors: Sangjine Park, Suwon-si (KR); Seungmin Shin, Suwon-si (KR); Jihoon Jeong, Seongnam-si (KR); Young-Hoo Kim, Yongin-si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 757 days.

(21) Appl. No.: 17/706,336

(22) Filed: Mar. 28, 2022

(65) Prior Publication Data

US 2023/0046060 A1     Feb. 16, 2023

(30) Foreign Application Priority Data

Aug. 12, 2021     (KR) ........................ 10-2021-0106834

(51) Int. Cl.
*G03F 7/30*          (2006.01)
*H01L 21/68*          (2006.01)
(Continued)

(52) U.S. Cl.
CPC .......... *G03F 7/3021* (2013.01); *G03F 7/3057* (2013.01); *H01L 21/68* (2013.01);
(Continued)

(58) Field of Classification Search
CPC .......................................... H01L 21/68–68792
See application file for complete search history.

(56) References Cited

U.S. PATENT DOCUMENTS 6,770,146 B2 *  8/2004  Koren ..................... B05C 11/08
156/345.55
6,800,833 B2 * 10/2004  Gregor ................... C30B 31/14
219/390
(Continued)

FOREIGN PATENT DOCUMENTS

JP          10270535  A     10/1998
KR        101053143  B1     8/2011
(Continued)

*Primary Examiner* — Dah-Wei D. Yuan
*Assistant Examiner* — Stephen A Kitt
(74) *Attorney, Agent, or Firm* — Muir Patent Law, PLLC

(57) ABSTRACT

A substrate rotating apparatus may include a spin chuck supporting a substrate and a stage rotating the spin chuck about an axis parallel to a first direction. The spin chuck may include a first magnetic element and a substrate supporting member thereon. The stage may include a stage housing, a rotating part rotating about the axis, an inner control unit controlling rotation of the rotating part, a power supplying part supplying a power to the rotating part, and a wireless communication part receiving a control signal from an outside and transmitting the control signal to the inner control unit. The rotating part may include a second magnetic element spaced apart from the first magnetic element and a rotation driver rotating the second magnetic element. The rotating part, the inner control unit, the power supplying part, and the wireless communication part may be placed in the stage housing.

19 Claims, 22 Drawing Sheets

D

(51) Int. Cl.

| | | |
|---|---|---|
| *H01L 21/687* | (2006.01) | |
| *H01M 10/44* | (2006.01) | |
| *H01M 10/46* | (2006.01) | |
| *H02J 7/00* | (2006.01) | |
| *H02J 50/20* | (2016.01) | |

(52) U.S. Cl.

CPC ........ *H01L 21/6875* (2013.01); *H01M 10/44* (2013.01); *H01M 10/46* (2013.01); *H02J 7/0063* (2013.01); *H02J 50/20* (2016.02)

(56) References Cited

U.S. PATENT DOCUMENTS

| | | | |
|---|---|---|---|
| 10,843,236 B2 | 11/2020 | Butterbaugh | |
| 10,910,253 B2 | 2/2021 | Nhofer et al. | |
| 2002/0170672 A1* | 11/2002 | Perlov ............... | H01L 21/67103 |
| | | | 156/345.31 |
| 2003/0164934 A1* | 9/2003 | Nishi ..................... | H01L 21/68 |
| | | | 355/75 |
| 2012/0255193 A1 | 10/2012 | Tamura | |
| 2015/0279721 A1* | 10/2015 | Kikumoto ......... | H01L 21/68728 |
| | | | 279/134 |
| 2016/0334162 A1 | 11/2016 | Kim et al. | |
| 2019/0385835 A1 | 12/2019 | Kobayashi et al. | |
| 2020/0373133 A1 | 11/2020 | Hatano et al. | |

FOREIGN PATENT DOCUMENTS

| | | |
|---|---|---|
| KR | 10-2016-0053337 A | 5/2016 |
| KR | 101681190 B1 | 12/2016 |
| KR | 1020190069595 A | 6/2019 |
| KR | 10-2021-0039753 A | 4/2021 |

* cited by examiner

SUBSTRATE ROTATING APPARATUS, SUBSTRATE PROCESSING SYSTEM INCLUDING THE SAME, AND SUBSTRATE PROCESSING METHOD USING THE SAME

CROSS-REFERENCE TO RELATED APPLICATIONS

This U.S. non-provisional patent application claims priority under 35 U.S.C. § 119 to Korean Patent Application No. 10-2021-0106834, filed on Aug. 12, 2021, in the Korean Intellectual Property Office, the entire contents of which are hereby incorporated by reference.

BACKGROUND OF THE INVENTION

The present disclosure relates to a substrate rotating apparatus, a substrate processing system including the same, and a substrate processing method using the same, and in particular, to a substrate rotating apparatus, which is configured to realize a good airtight property in a high-pressure chamber, and a substrate processing system including the same, and a semiconductor processing method using the same.

A process of fabricating a semiconductor device includes various processes. For example, the semiconductor device may be fabricated through a photolithography process, an etching process, a deposition process, and a plating process. A wetting process of supplying a liquid material (e.g., developing solution) on a wafer may be performed during the photolithography process. In addition, a drying process may be performed to remove the liquid material from the wafer. Various methods are used to form the liquid material on the wafer or to remove the liquid material from the wafer.

SUMMARY

An embodiment of the inventive concept provides a substrate rotating apparatus, which is disposed in a high-pressure chamber to rotate a substrate, a substrate processing system including the same, and a substrate processing method using the same.

An embodiment of the inventive concept provides a substrate rotating apparatus, which is configured to hermetically seal elements for rotation under high-pressure environment, a substrate processing system including the same, and a substrate processing method using the same.

An embodiment of the inventive concept provides a substrate rotating apparatus, which is configured to improve efficiency in a process of drying a substrate, a substrate processing system including the same, and a substrate processing method using the same.

An embodiment of the inventive concept provides a substrate rotating apparatus, which is configured to prevent a substrate from being contaminated, a substrate processing system including the same, and a substrate processing method using the same.

According to an embodiment of the inventive concept, a substrate rotating apparatus may include a spin chuck configured to support a substrate and a stage configured to rotate the spin chuck about an axis parallel to a first direction. The spin chuck may include a first magnetic element and a substrate supporting member provided on the first magnetic element. The stage may include a stage housing, a rotating part configured to rotate about the axis parallel to the first direction, an inner control unit configured to control rotation of the rotating part, a power supplying part configured to supply a power to the rotating part, and a wireless communication part configured to receive a control signal from an outside and configured to transmit the control signal to the inner control unit. The rotating part may include a second magnetic element spaced apart from the first magnetic element and a rotation driver configured to rotate the second magnetic element. The rotating part, the inner control unit, the power supplying part, and the wireless communication part may be placed in the stage housing.

According to an embodiment of the inventive concept, a substrate processing system may include a drying chamber configured to be used to dry a substrate, and a drying fluid supplying part configured to supply a drying fluid to the drying chamber. The drying chamber may include a chamber housing provided to have a process space and a substrate rotating apparatus disposed in the chamber housing. The substrate rotating apparatus may include a stage and a spin chuck configured to be levitated upward from the stage to rotate in a non-contact state with the stage. The stage may include an inner control unit configured to control rotation of the spin chuck, a power supplying part configured to supply a power for the rotation of the spin chuck, a wireless communication part configured to receive a control signal from an outside and to transmit the received control signal to the inner control unit, and a stage housing provided to enclose the inner control unit, the power supplying part, and the wireless communication part.

According to an embodiment of the inventive concept, a substrate processing method may include disposing a substrate in a drying chamber, rotating the substrate, and supplying a drying fluid into the drying chamber. The disposing of the substrate in the drying chamber may include placing the substrate on a spin chuck of a substrate rotating apparatus. The rotating of the substrate may include levitating the spin chuck from a stage, and rotating the spin chuck using the stage. The rotating of the spin chuck may include rotating the spin chuck using a power, which is supplied from a power supplying part placed in a housing of the stage.

DETAILED DESCRIPTION

Figure 1:
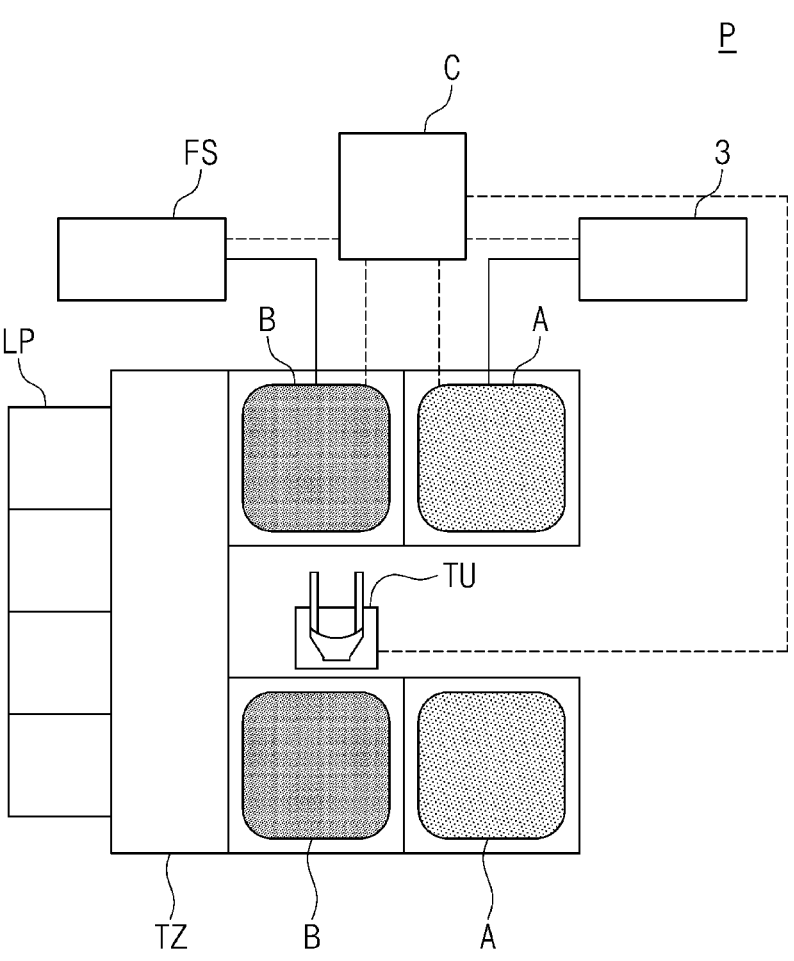
FIG. 1 is a schematic diagram illustrating a substrate processing system according to an embodiment of the inventive concept.

Example embodiments of the inventive concepts will now be described more fully with reference to the accompanying drawings, in which example embodiments are shown. Like reference numerals in the drawings denote like elements, and thus their duplicated descriptions will be omitted.

FIG. 1 is a schematic diagram illustrating a substrate processing system according to an embodiment of the inventive concept.

Referring to FIG. 1, a substrate processing system P may be provided. The substrate processing system P may be a system configured to treat a substrate during a semiconductor fabrication process. For example, the substrate processing system P may be a system, which is configured to perform a wetting process or a drying process on the substrate. For example, the substrate processing system P may be used to spray a liquid material on the substrate or perform a wet process on the substrate or may be used to remove a liquid material from a top surface of the substrate or to dry and clean the substrate. In the present specification, the term 'substrate' may be a semiconductor wafer. The semiconductor wafer may include or may be a silicon wafer, but the inventive concept is not limited to this example. The substrate processing system P may include a loading port LP, a transfer region TZ, a wet chamber B, a fluid supplying part FS, a transfer unit TU, a drying chamber A, a drying fluid supplying part 3, and an outer control unit C.

The loading port LP may be a port, on which the wafer is loaded. For example, a wafer, on which various semiconductor fabrication processes are performed, may be loaded on the loading port LP. In an embodiment, the loading ports LP may be provided. A plurality of wafers may be loaded on each of the loading ports LP. However, in order to reduce complexity in the description and to provide better understanding of the inventive concept, one of the loading ports LP will be described exemplarily.

The transfer region TZ may be configured to transfer the wafer, which is loaded on the loading port LP. For example, the transfer unit TU may be used to transfer the wafer, which is loaded on the loading port LP, to the wet chamber B and/or the drying chamber A. The transfer region TZ may be provided to face a plurality of the loading ports LP.

The wet chamber B may be a chamber which is configured to perform a wet process on the substrate. When a wafer is placed in the wet chamber B, various liquid materials (e.g., chemicals and/or IPA) may be provided on the wafer. The providing of the liquid material may be performed in various manners. For example, in the case where a liquid material sprayed on a rotating substrate, the liquid material may be uniformly sprayed on the substrate by a centrifugal force. In an embodiment, a plurality of the wet chambers B may be provided. For example, a pair of the wet chambers B may be provided. The pair of the wet chambers B may be disposed to face each other. However, in order to reduce complexity in the description and to provide better understanding of the inventive concept, one of the wet chambers B will be described exemplarily.

The fluid supplying part FS may be configured to supply fluid into the wet chamber B. For this, the fluid supplying part FS may include a fluid tank, a pump, and so forth. Fluid, which is supplied from the fluid supplying part FS to the wet chamber B, may be referred to as 'process fluid'. The process fluid may include various chemicals and/or water. For example, the process fluid may include or may be developing solution or iso propyl alcohol (IPA).

The transfer unit TU may be configured to transfer a substrate. For example, the transfer unit TU may be configured to transfer the wafer from the loading port LP to the wet chamber B through the transfer region TZ. In addition, the transfer unit TU may unload the wafer from the wet chamber B and may transfer the unloaded wafer to the drying chamber A. For this, the transfer unit TU may include an actuator (e.g., a motor). Although FIG. 1 illustrates an example in which just one transfer unit TU is provided, the inventive concept is not limited to this example. For example, the substrate processing system P may include two or more transfer units TU in certain embodiments.

The drying chamber A may be configured to perform a drying process on a substrate. For example, the drying chamber A may be used to perform the drying and/or cleaning process on the wafer unloaded from the wet chamber B. For example, in the drying chamber A, the liquid material may be removed from the wafer, which is unloaded from the wet chamber B and is coated with the developing solution and/or the IPA. The drying chamber A may be placed near the wet chamber B. For example, the drying chamber A may be placed right next to the wet chamber B. In this case, the wafer may be quickly transferred from the wet chamber B to the drying chamber A by the transfer unit TU. In an embodiment, a plurality of the drying chambers A may be provided. For example, a pair of the drying chambers A may be provided. The pair of the drying chambers A may be disposed to face each other. However, one of the drying chambers A will be described below, for brevity's sake. The drying chamber A will be described in more detail with reference to FIG. 2.

The drying fluid supplying part 3 may be configured to supply fluid into the drying chamber A. For example, the drying fluid supplying part 3 may supply a drying fluid, which will be sprayed into the drying chamber A. The drying fluid, which is sprayed by the drying fluid supplying part 3, may be carbon dioxide ($CO_2$). The carbon dioxide ($CO_2$), which is sprayed into the drying chamber A, may be in a supercritical fluid (SCF) state. The drying fluid supplying part 3 will be described in more detail with reference to FIG. 7.

The outer control unit C may be configured to control the wet chamber B, the drying chamber A, the fluid supplying part FS, the drying fluid supplying part 3, and/or the transfer unit TU. For example, the outer control unit C may control the drying chamber A and the drying fluid supplying part 3 to adjust the drying process on the substrate. For example, the outer control unit C may control an inner control unit 14 (e.g., see FIG. 5A) in the drying chamber A to rotate the substrate or may control the drying fluid supplying part 3 to adjust the spraying of the drying fluid. This will be described in more detail below.

Figure 2:
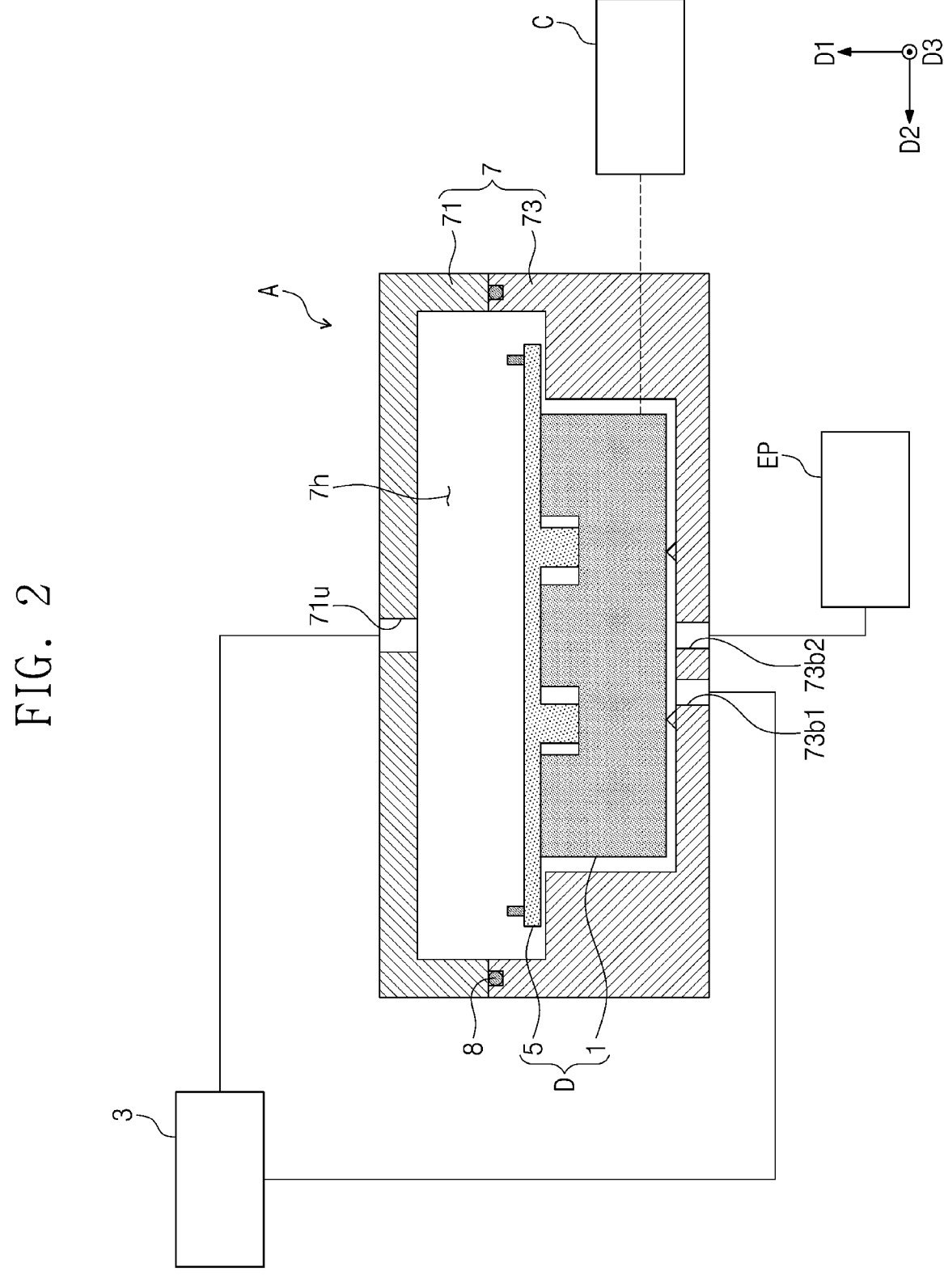
FIG. 2 is a sectional view illustrating a drying chamber according to an embodiment of the inventive concept.
Figure 3:
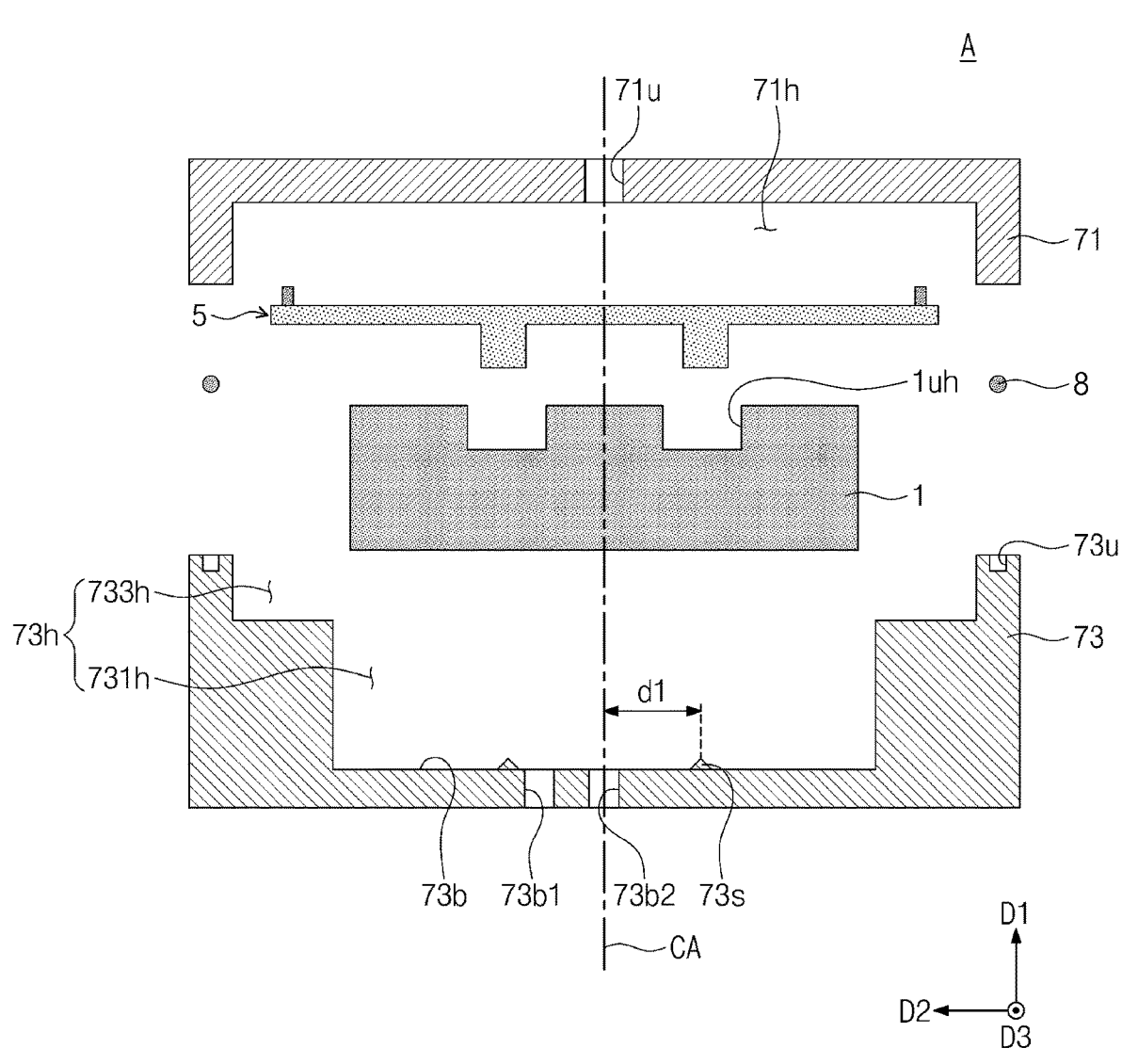
FIG. 3 is an exploded sectional view illustrating a drying chamber according to an embodiment of the inventive concept.
Figure 4:
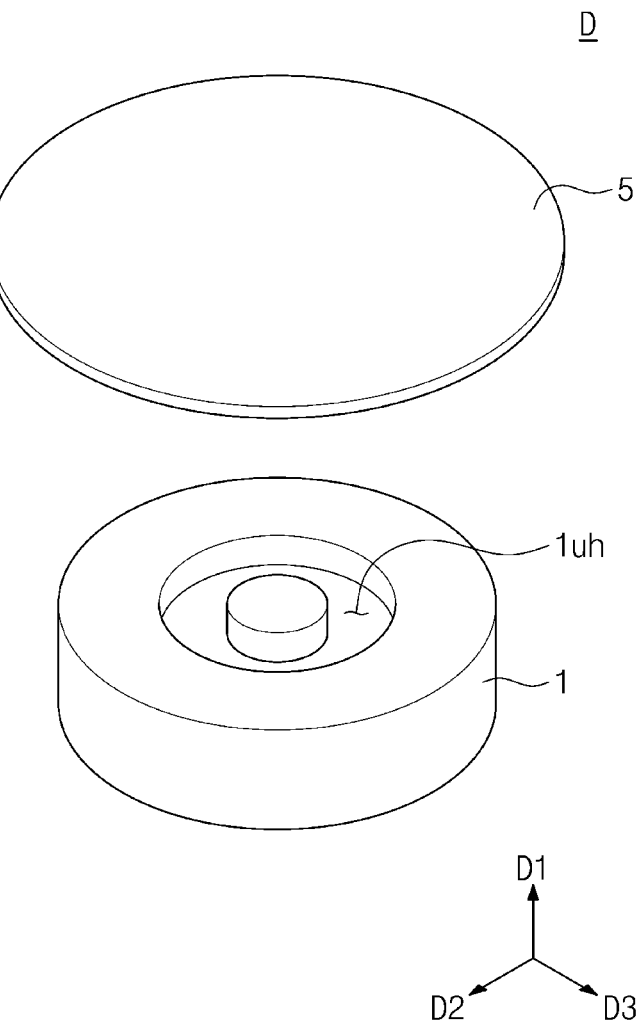
FIG. 4 is a perspective view illustrating a substrate rotating apparatus according to an embodiment of the inventive concept.

FIG. 2 is a sectional view illustrating a drying chamber according to an embodiment of the inventive concept, FIG. 3 is an exploded sectional view illustrating a drying chamber according to an embodiment of the inventive concept, and FIG. 4 is a perspective view illustrating a substrate rotating apparatus according to an embodiment of the inventive concept.

In the present application, as shown in FIG. 2, the reference notations D1, D2, and D3 will be used to denote a first direction, a second direction, and a third direction, respectively, which are not parallel to each other. The first direction D1 may be an upward direction. Each of the second and third directions D2 and D3 may be a horizontal direction. For example, the first, second and third directions may be perpendicular to each other.

Referring to FIG. 2, the drying chamber A may include a chamber housing 7, a sealing member 8, and a substrate rotating apparatus D.

Referring to FIGS. 2 and 3, the chamber housing 7 may be provided to have a process space 7*h*. A drying process and/or a cleaning process on a substrate may be performed in the process space 7*h*. The chamber housing 7 may include an upper chamber 71 and a lower chamber 73. The upper chamber 71 may be provided to have an upper space 71*h*. The upper space 71*h* may be open downward. The lower chamber 73 may be provided to have a lower space 73*h*. The lower space 73*h* may be open upward. The upper chamber 71 may be selectively combined to the lower chamber 73. When the upper chamber 71 is combined to the lower chamber 73, the upper space 71*h* and the lower space 73*h* may be connected to each other, thereby forming the process space 7*h*.

The upper chamber 71 may be provided to further have an upper inflow hole 71*u*. The upper inflow hole 71*u* may extend upward from the upper space 71*h*. The upper inflow hole 71*u* may be provided to penetrate the upper chamber 71. The upper inflow hole 71*u* may be connected to the drying fluid supplying part 3. The drying fluid, which is supplied from the drying fluid supplying part 3, may be supplied into the process space 7*h* through the upper inflow hole 71*u*. In an embodiment, the upper inflow hole 71*u* may be formed on a center axis CA of the chamber housing 7.

The lower space 73*h* may include a first lower space 731*h* and a second lower space 733*h*. The first lower space 731*h* may be located below the second lower space 733*h*. A diameter of the second lower space 733*h* in a horizontal direction may be larger than a diameter of the first lower space 731*h* in the horizontal direction.

The lower chamber 73 may be provided to further have a sealing member loading hole 73*u*, a lower inflow hole 73*b*1, and a lower outflow hole 73*b*2. The sealing member loading hole 73*u* may be a hole that is recessed downward from a top surface of the lower chamber 73 by a specific depth. For example, the sealing member loading hole 73*u* may be a groove or a trench formed along a top surface of the lower chamber 73. For example, the sealing member loading hole may have a hole shape along a boundary between the upper chamber 71 and the lower chamber 73 when the upper chamber 71 and the lower chamber 73 are combined together. The sealing member 8 may be inserted into the sealing member loading hole 73*u*. The sealing member 8 may be in a state inserted into the sealing member loading hole 73*u*, when the lower chamber 73 is combined with the upper chamber 71. The lower inflow hole 73*b*1 may extend from the lower space 73*h* in a downward direction. The lower inflow hole 73*b*1 may be provided to penetrate the lower chamber 73. The lower inflow hole 73*b*1 may be connected to the drying fluid supplying part 3. The drying fluid, which is supplied from the drying fluid supplying part 3 through the lower inflow hole 73*b*1, may be supplied into the process space 7*h*. In an embodiment, the lower inflow hole 73*b*1 may be laterally spaced apart from the center axis CA of the chamber housing 7. The lower outflow hole 73*b*2 may be provided beside the lower inflow hole 73*b*1. The lower outflow hole 73*b*2 may be connected to an exhausting part EP. Fluid in the process space 7*h* may be exhausted to the exhausting part EP through the lower outflow hole 73*b*2. The lower outflow hole 73*b*2 may be placed on the center axis CA of the chamber housing 7. For example, the lower inflow hole 73*b*1 and the lower outflow hole 73*b*2 may be laterally spaced apart from each other.

The lower chamber 73 may further include a stage supporting member 73*s*. The stage supporting member 73*s* may be placed on a bottom surface 73*b* of the lower chamber 73. The stage supporting member 73*s* may be configured to support the substrate rotating apparatus D. For example, the stage supporting member 73*s* may be configured to be in contact with a bottom surface of a stage 1 and thereby to support the stage 1. The stage supporting member 73*s* may be laterally spaced apart from the center axis CA of the chamber housing 7. For example, the stage supporting member 73*s* may be laterally spaced apart from the center axis CA of the chamber housing 7 by a first distance d1. Thus, the stage supporting member 73*s* may not be overlapped with the lower outflow hole 73*b*2.

The sealing member 8 may be inserted into the sealing member loading hole 73*u*. When the upper and lower chambers 71 and 73 are combined to each other, the sealing member 8 may maintain an airtight property between the upper and lower chambers 71 and 73. For example, the sealing member 8 may be an O-ring.

Referring to FIGS. 2 to 4, the substrate rotating apparatus D may be disposed in the chamber housing 7. For example, the substrate rotating apparatus D may be provided such that it can be attached to and detached from the chamber housing 7. The substrate rotating apparatus D may be configured to rotate the substrate. For example, the substrate rotating apparatus D may be configured to rotate the substrate about an axis parallel to the first direction D1. The substrate rotating apparatus D, which is disposed in the chamber housing 7, may be supported by the stage supporting member 73*s*. The substrate rotating apparatus D may include the stage 1 and a spin chuck 5.

The stage 1 may be configured to rotate the spin chuck 5. For example, the stage 1 may be configured to levitate the spin chuck 5 upward from the stage 1 and to rotate the levitated spin chuck 5 about an axis parallel to the first direction D1. The stage 1 may be supported by the stage supporting member 73*s*, and at this stage, a bottom surface of the stage 1 may be in contact with the stage supporting member 73*s*. The stage 1 may be provided to have a symmetric shape about the center axis CA of the chamber housing 7. The stage 1 may be provided to have a spin chuck placing hole 1*uh*. The spin chuck placing hole 1*uh* may be a hole that is recessed downward from a top surface of the stage 1. A portion of the spin chuck 5 may be inserted in the spin chuck placing hole 1*uh*. The stage 1 will be described in more detail with reference to FIGS. 5A and 5B.

The spin chuck 5 may be configured to support the substrate. For example, the substrate may be disposed on the spin chuck 5. The spin chuck 5 may be disposed on the stage 1. A portion of the spin chuck 5 may be inserted into the spin chuck placing hole 1*uh*. The spin chuck may be in contact with the top surface of the stage 1. In addition, the spin chuck 5 may be levitated upward from the top surface of the stage 1. The spin chuck 5 may be rotated by the stage 1. For example, the spin chuck 5 may be levitated upward from the stage 1, while the substrate is disposed on the spin chuck 5 and the spin chuck 5 is rotated. The spin chuck 5 may be rotated by the stage 1 while not in contact with the stage 1. For example, the spin chuck 5 and the stage 1 may behave like a non-contact rotary motor. The spin chuck 5 will be described in more detail with reference to FIGS. 5A and 5B.

Figure 5A:
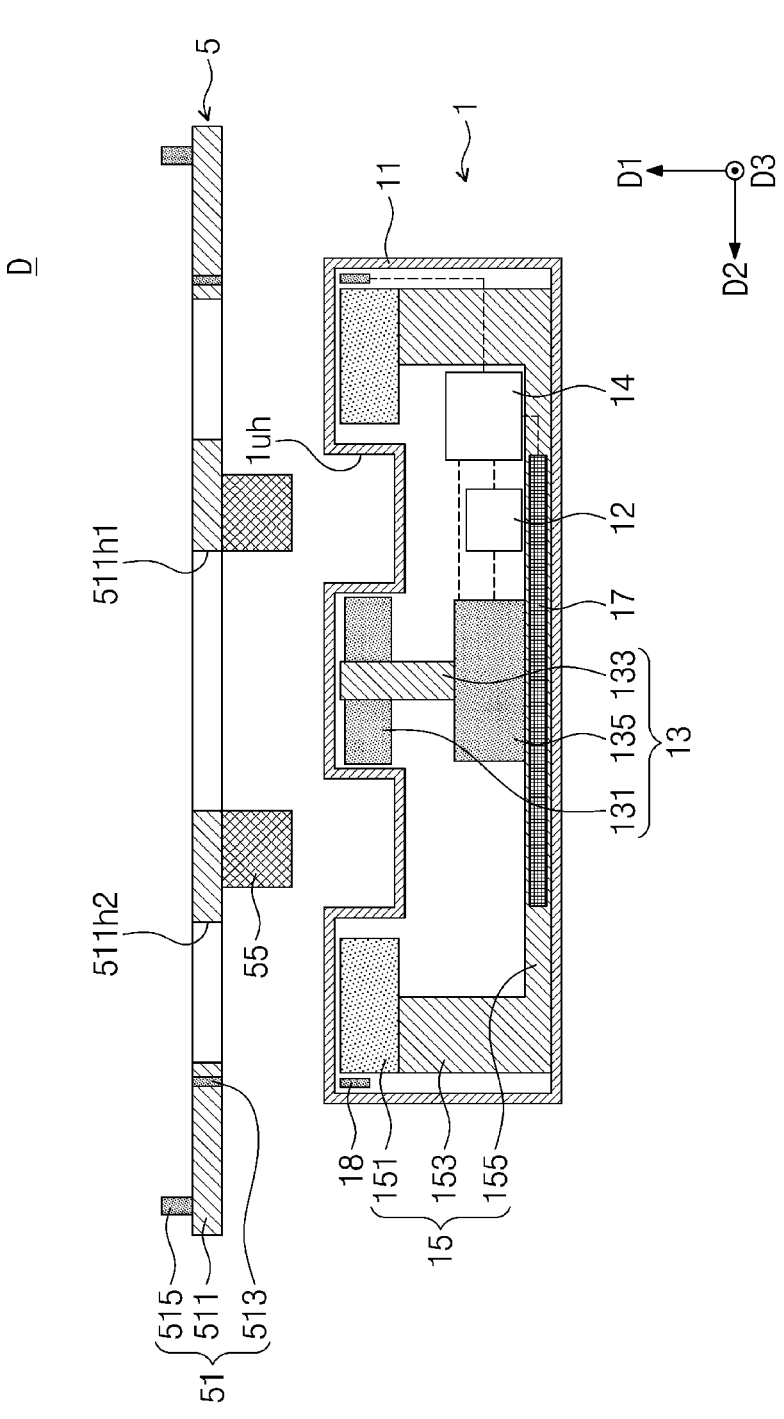
FIG. 5A is a sectional view illustrating a substrate rotating apparatus according to an embodiment of the inventive concept.
Figure 5B:
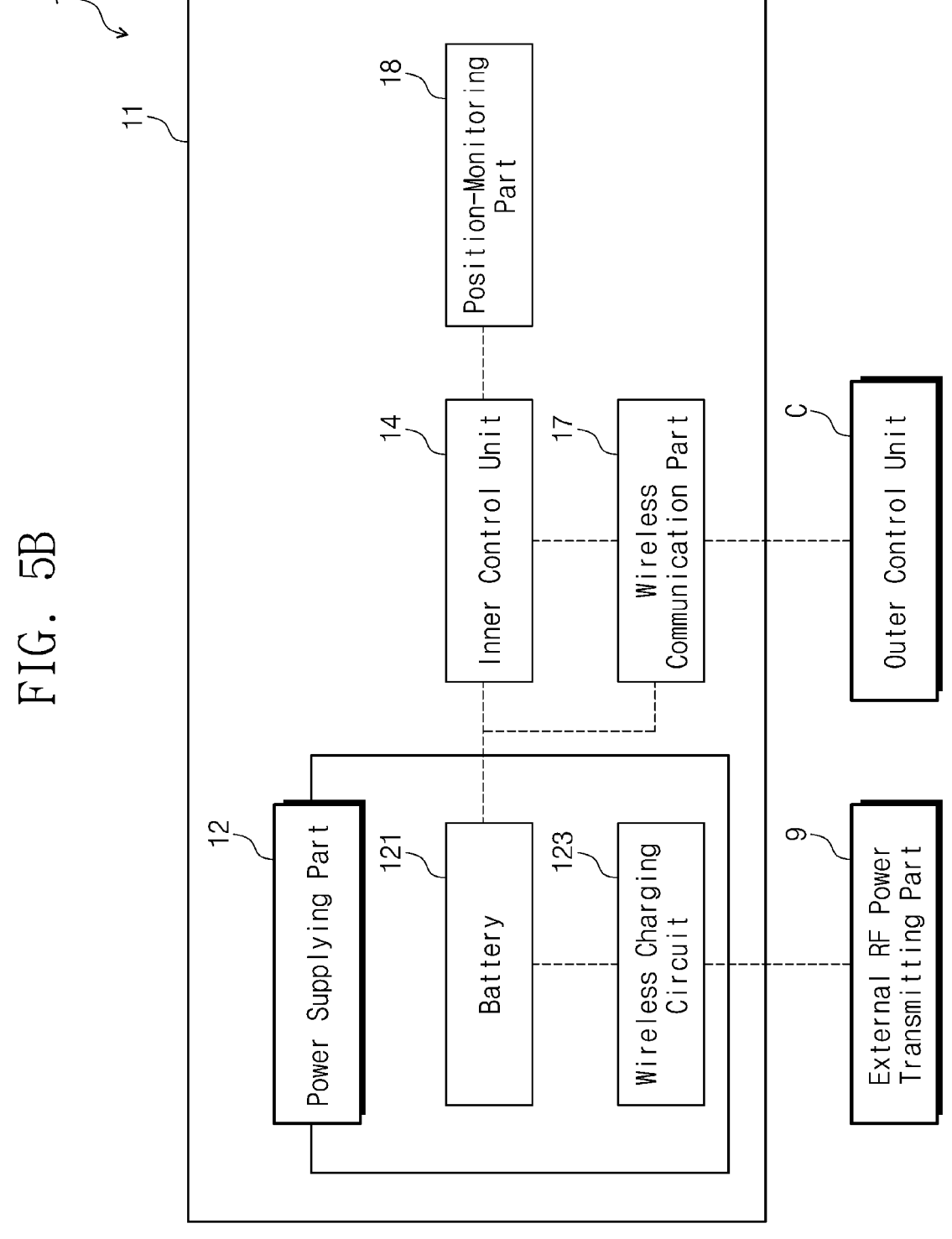
FIG. 5B is a conceptual diagram illustrating a portion of a substrate rotating apparatus according to an embodiment of the inventive concept.
Figure 6:
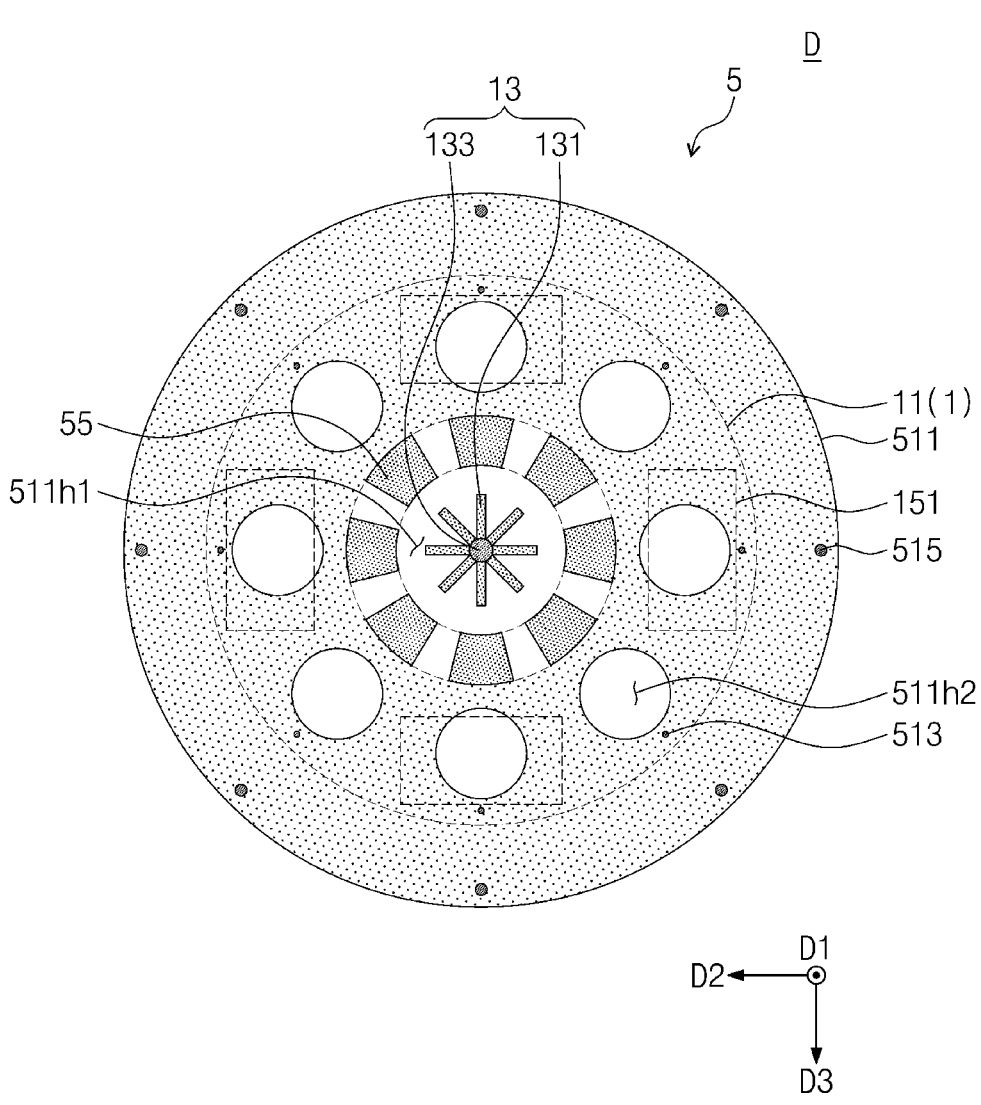
FIG. 6 is a plan view illustrating a substrate rotating apparatus according to an embodiment of the inventive concept.

FIG. 5A is a sectional view illustrating a substrate rotating apparatus according to an embodiment of the inventive concept, FIG. 5B is a conceptual diagram illustrating a portion of a substrate rotating apparatus according to an embodiment of the inventive concept, and FIG. 6 is a plan view illustrating a substrate rotating apparatus according to an embodiment of the inventive concept.

Referring to FIGS. 5A and 6, the spin chuck 5 may include a substrate supporting member 51 and a first magnetic element 55.

The substrate supporting member 51 may be provided to support a substrate. The substrate supporting member 51 may be placed on the first magnetic element 55. The substrate supporting member 51 may include a supporting plate 511, a second position-monitoring part 513, and a supporting pin 515.

The supporting plate 511 may have a shape of a circular plate. The supporting plate 511 may be coupled to the first magnetic element 55. The supporting plate 511 may be formed of or include a material having a low thermal expansion coefficient and low thermal conductivity. For example, the supporting plate 511 may be formed of or include at least one of polytetrafluoroethylene (PTFE) based resins. The surface of the supporting plate 511 may be coated with the PTFE. Alternatively, the entirety of the supporting plate 511 may be formed of the PTFE. The supporting plate 511 may be provided to have a center hole $511h1$ and a penetration hole $511h2$. The center hole $511h1$ may be provided to vertically penetrate a center of the supporting plate 511. The penetration hole $511h2$ may be placed outside the center hole $511h1$. In an embodiment, a plurality of the penetration holes $511h2$ may be provided. For example, eight penetration holes $511h2$ may be provided, as shown in FIG. 6. The penetration holes $511h2$ may be spaced apart from each other in a circumferential direction. A weight of the supporting plate 511 may be reduced, due to the penetration holes $511h2$. For example, the penetration holes $511h2$ may be beneficial for controlling the rotation of the substrate supporting member 51.

The second position-monitoring part 513 may be coupled to the supporting plate 511. The second position-monitoring part 513 may be exposed to the outside of the supporting plate 511 or may be buried in the supporting plate 511. The second position-monitoring part 513 may be sensed by a first position-monitoring part 18. The first position-monitoring part 18 may be configured to sense the second position-monitoring part 513 and thereby to find a position of the spin chuck 5 rotating on the stage 1. For this, the second position-monitoring part 513 may be formed of or include at least one of magnetic materials. For example, the second position-monitoring part 513 may be formed of or include at least one of metallic materials. Alternatively, the second position-monitoring part 513 may have a shape that can be sensed by an optical sensor. In an embodiment, a plurality of the second position-monitoring parts 513 may be provided. As shown in FIG. 6, the second position-monitoring parts 513 may be spaced apart from each other in a circumferential direction. However, one of the second position-monitoring parts 513 will be described below, for brevity's sake.

The supporting pin 515 may be placed on the supporting plate 511. The supporting pin 515 may support the substrate. For example, the substrate may be disposed on the supporting pin 515. Alternatively, the substrate may be disposed to be in contact with a side surface of the supporting pin 515 and thereby to be fastened by the supporting pin 515. In an embodiment, a plurality of the supporting pins 515 may be provided. As shown in FIG. 6, the supporting pins 515 may be spaced apart from each other in a circumferential direction. However, one of the supporting pins 515 will be described below, for brevity's sake.

The first magnetic element 55 may be placed below the substrate supporting member 51. The first magnetic element 55 may include a permanent magnet. Alternatively, the first magnetic element 55 may be an electromagnet. In an embodiment, a plurality of the first magnetic elements 55 may be provided. For example, eight first magnetic elements 55 may be provided, as shown in FIG. 6. The first magnetic elements 55 may be spaced apart from each other in a circumferential direction. However, one of the first magnetic elements 55 will be described below, for brevity's sake. In the above description, it has been described that the first magnetic element 55 is separately placed below the substrate supporting member 51, e.g., on a bottom surface of the substrate supporting member 51, but the inventive concept is not limited to this example. For example, the first magnetic element 55 may be placed in the supporting plate 511 in certain embodiments such that the supporting plate 511 encloses the entire surface of the first magnetic element 55. In this case, the surface of the first magnetic element 55 may not be provided to the outside. For example, the surface of the first magnetic element 55 may be coated with PTFE.

The stage 1 may be provided to rotate the spin chuck 5. The stage 1 may include a stage housing 11, a rotating part 13, a fastening part 15, a power supplying part 12, the inner control unit 14, a wireless communication part 17, and the first position-monitoring part 18.

The stage housing 11 may form an outer appearance of the stage 1. The stage housing 11 may be provided to enclose the rotating part 13, the fastening part 15, the power supplying part 12, the inner control unit 14, and the wireless communication part 17. Accordingly, the rotating part 13, the fastening part 15, the power supplying part 12, the inner control unit 14 and the wireless communication part 17 may not be exposed to the outside. The stage housing 11 may be formed of or include a material having a low thermal expansion coefficient and low thermal conductivity. For example, the stage housing 11 may be formed of or include at least one of polytetrafluoroethylene (PTFE) based resins. A surface of the stage housing 11 may be coated with PTFE. Alternatively, the entire surface of the stage housing 11 may be coated with the PTFE.

The rotating part 13 may rotate about an axis parallel to the first direction D1. The rotating part 13 may include a second magnetic element 131, a rotation axle/shaft/pivot 133, and a rotation driver 135. The second magnetic element 131 may be spaced apart from the first magnetic element 55. For example, the second magnetic element 131 may be spaced apart from the first magnetic element 55 in a horizontal direction. The second magnetic element 131 may include or may be a permanent magnet. Alternatively, the second magnetic element 131 may be an electromagnet. In an embodiment, a plurality of the second magnetic elements 131 may be provided. For example, eight second magnetic elements 131 may be provided, as shown in FIG. 6. The second magnetic elements 131 may be spaced apart from each other in a circumferential direction. However, one of the second magnetic elements 131 will be described below, for brevity's sake. A magnetic field produced by the second magnetic element 131 may affect the first magnetic element 55. For example, once the second magnetic element 131 moves, the first magnetic element 55 may also move. For example, once the second magnetic element 131 rotates in a state spaced apart from the first magnetic element 55 by a specific distance in the horizontal direction, the first mag- netic element 55 may also rotate. The rotation axle 133 may be combined with the second magnetic element 131. The rotation axle 133 may extend in the first direction D1 to connect the second magnetic element 131 to the rotation driver 135. The rotation driver 135 may be configured to rotate the rotation axle 133. The rotation driver 135 may rotate the second magnetic element 131 about an axis parallel to the first direction D1, using the rotation axle 133. For this, the rotation driver 135 may include an actuator (e.g., an electric motor).

The fastening part 15 may be spaced apart from the rotating part 13. The fastening part 15 may not rotate, unlike the rotating part 13. The fastening part 15 may include a third magnetic element 151, an inner supporting member 153, and a base 155. The third magnetic element 151 may be configured to levitate the first magnetic element 55. For this, the third magnetic element 151 may include or may be a permanent magnet or an electromagnet. The third magnetic element 151 may be placed outside the second magnetic element 131. The fastening part 15 may include a plurality of third magnetic elements 151. For example, four third magnetic elements 151 may be provided, as shown in FIG. 6. However, one of the third magnetic elements 151 will be described below, for brevity's sake. The inner supporting member 153 may vertically extend. The inner supporting member 153 may support the third magnetic element 151. The base 155 may support the inner supporting member 153.

Referring to FIGS. 5A and 5B, the power supplying part 12 may be configured to supply a power to the rotating part 13, the inner control unit 14, and the wireless communica- tion part 17. The power, which is supplied from the power supplying part 12, may be used to drive the rotation driver 135 and to operate the inner control unit 14 and the wireless communication part 17. The power supplying part 12 may be charged in a wireless manner. For this, the power sup- plying part 12 may include a battery 121 and a wireless charging circuit 123. The battery 121 may be configured to supply an energy to the rotating part 13, the inner control unit 14, and the wireless communication part 17. For this, the battery 121 may have an energy storable structure. The battery 121 may be configured such that it can be repeatedly charged. For example, the battery 121 may be a rechargeable battery. The wireless charging circuit 123 may include a circuit structure capable of charging the battery 121. For example, the wireless charging circuit 123 may include a structure that can charge the battery 121 through interaction with the outside. The wireless charging circuit 123 may charge the battery 121 in various manners. For example, the wireless charging circuit 123 may charge the battery 121 using an electromagnetic wave transmitted from the outside. For example, the wireless charging circuit 123 may be configured to receive and rectify a radio frequency (RF) signal, which is transmitted from an external RF power transmitting part 9, and to charge the battery 121 using the RF signal. For example, the RF signal, which is transmitted to the wireless charging circuit 123, may have a frequency of about 900 MHz to 24 GHz. For this, the wireless charging circuit 123 may include a wireless power receiver, a rectifier, a charging IC, and so forth. However, the inventive concept is not limited to this example, and the wireless charging circuit 123 may be configured to charge the battery 121 in other manners. For example, the wireless charging circuit 123 may charge the battery 121 in an electromagnetic induction manner or a resonance manner.

The inner control unit 14 may receive a power from the power supplying part 12. The inner control unit 14 may control the rotation of the rotating part 13. For example, the inner control unit 14 may control the driving operation of the rotation driver 135. For this, the inner control unit 14 may include a memory and a processor. The memory may be an IC chip, which is used to store program, instruction, and data for the rotation driver 135. The processor may generate a control signal, which is used to control the rotation driver 135, based on the program, instruction, and/or data stored in the memory. The inner control unit 14 may be controlled by the outer control unit C. For example, the inner control unit 14 may be operated under the control of the outer control unit C, because the outer control unit C and the inner control unit 14 are connected to each other through the wireless communication part 17. The inner control unit 14 may be connected to the position-monitoring part 18. The position- monitoring part 18 may be the first position-monitoring part 18 of FIG. 5A. The inner control unit 14 may receive information from the position-monitoring part 18 and may control the rotation driver 135 using the received informa- tion. This will be described in more detail below.

The wireless communication part 17 may be configured to receive a control signal from the outside and to transmit the received control signal to the inner control unit 14. For example, as described above, the control signal, which is transmitted from the outer control unit C, may be transmitted to the inner control unit 14 through the wireless communi- cation part 17. In an embodiment, the wireless communica- tion part 17 may be configured to transmit the control signal from the inner control unit 14 to the outer control unit C. For this, the wireless communication part 17 may include a wireless receiver and a wireless transmitter.

The first position-monitoring part 18 may be placed in the stage housing 11. The first position-monitoring part 18 may be placed at a position corresponding to the second position- monitoring part 513. The first position-monitoring part 18 may sense the presence or absence of the second position- monitoring part 513. As an example, in the case where the second position-monitoring part 513 includes a magnetic material, the first position-monitoring part 18 may include a sensor capable of sensing a magnetic field. As another example, the first position-monitoring part 18 may include an optical sensor which is configured to sense an image or an optical signal of the presence or absence of the second position-monitoring part 513.

Figure 7:
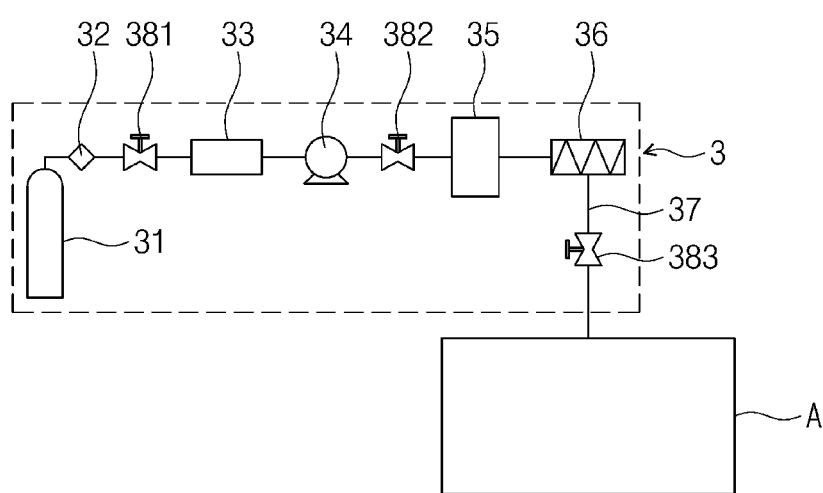
FIG. 7 is a schematic diagram illustrating a drying fluid supplying part according to an embodiment of the inventive concept.

FIG. 7 is a schematic diagram illustrating a drying fluid supplying part according to an embodiment of the inventive concept.

Referring to FIG. 7, the drying fluid supplying part 3 may include a drying fluid supplying source 31, a drying fluid line 37, a filter 32, a first valve 381, a condenser 33, a pump 34, a second valve 382, a tank 35, a heater 36, and a third valve 383.

The drying fluid supplying source 31 may be configured to supply a drying fluid. For example, the drying fluid supplying source 31 may be configured to store and supply a gaseous fluid, which will be transformed to a supercritical fluid. In the case where the drying fluid is supercritical carbon dioxide ($CO_2$), the drying fluid supplying source 31 may store carbon dioxide gas. Temperature of the carbon dioxide gas, which is supplied by the drying fluid supplying source 31 may range from about 10° C. to about 30° C. In addition, pressure of the carbon dioxide gas supplied by the drying fluid supplying source 31 may range from about 4 MPa to about 6 MPa. The drying fluid supplied from the drying fluid supplying source 31 may flow through the drying fluid line 37.

The drying fluid line 37 may be used as a path for supplying the drying fluid from the drying fluid supplying source 31 to the drying chamber A. The filter 32 may be placed on the drying fluid line 37. The filter 32 may be configured to remove a contamination material in the drying fluid. The first valve 381 may be configured to open or close a conduit between the filter 32 and the condenser 33 and thereby to control the flow of the drying fluid.

The condenser 33 may be configured to cool the carbon dioxide gas, which is supplied from the drying fluid supplying source 31. Accordingly, the carbon dioxide gas may be liquefied by the condenser 33. For example, the temperature of the carbon dioxide liquefied by the condenser 33 may range from about 0° C. to about 6° C. In addition, the pressure of the carbon dioxide liquefied by the condenser 33 may range from about 4 MPa to about 6 MPa.

The pump 34 may be configured to increase the pressure of the drying fluid liquefied by the condenser 33. For example, the pressure of the carbon dioxide liquefied by the condenser 33 may be increased to a range from about 15 MPa to about 25 MPa by the pump 34. In addition, the temperature of the carbon dioxide liquefied by the condenser 33 may be increased to a range from about 15° C. to about 25° C., while passing through the pump 34. The second valve 382 may be configured to open or close a conduit between the pump 34 and the tank 35 and thereby to control the flow of the drying fluid. The tank 35 may be configured to store the drying fluid compressed by the pump 34.

The heater 36 may be configured to heat the drying fluid flowing through the drying fluid line 37. For example, the heater 36 may be used to heat the liquefied carbon dioxide, which is compressed by the pump 34. As a result of this heating process, the liquefied carbon dioxide may become a supercritical state. The carbon dioxide, which is heated by the heater 36 and is in a supercritical state, may be in a high-temperature high-pressure state. For example, the temperature of the carbon dioxide, which is in the supercritical state while flowing through the heater 36, may range from about 60° C. to about 90° C. In addition, the pressure of the carbon dioxide, which is in the supercritical state while flowing through the heater 36, may range from about 15 MPa to about 25 MPa. The third valve 383 may be configured to control the flow of the carbon dioxide, which is in the supercritical state while flowing through the heater 36. The carbon dioxide in the supercritical state may be supplied into the drying chamber A through the third valve 383.

Figure 8:
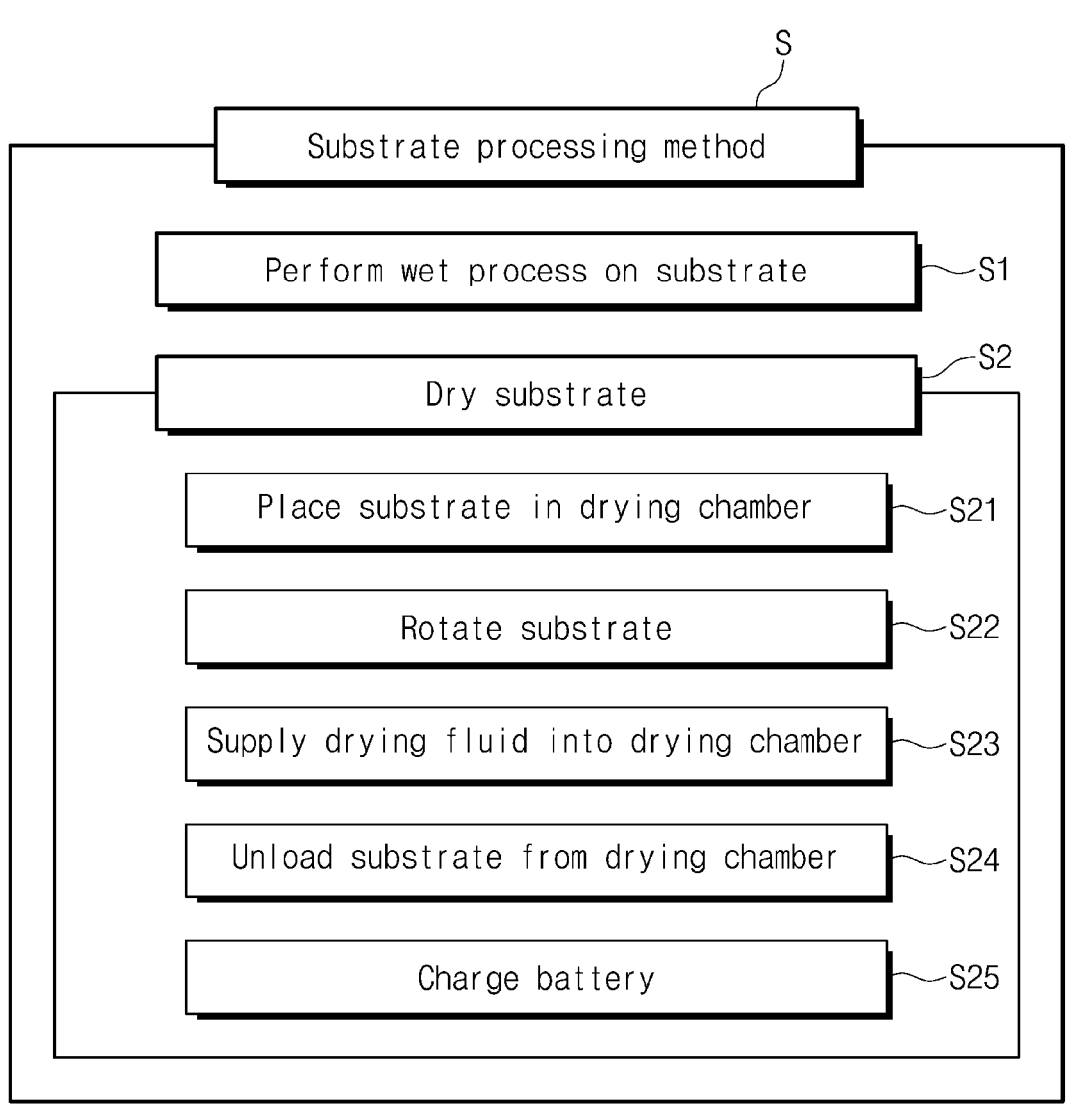
FIG. 8 is a flow chart illustrating a substrate processing method according to an embodiment of the inventive concept.

FIG. 8 is a flow chart illustrating a substrate processing method according to an embodiment of the inventive concept.

Referring to FIG. 8, a substrate processing method S may be provided. The substrate processing method S may be a method of processing a substrate using the substrate processing system P described with reference to FIG. 1. For example, the substrate processing method S may be a method of performing wet and/or drying processes on a substrate using the substrate processing system P. For this, the substrate processing method S may include performing a wet process on a substrate (in S1) and drying the substrate (in S2).

The drying of the substrate (in S2) may include placing the substrate in a drying chamber (in S21), rotating the substrate (in S22), supplying a drying fluid into the drying chamber (in S23), unloading the substrate from the drying chamber (in S24), and charging a battery (in S25).

Hereinafter, each step in the substrate processing method S of FIG. 8 will be described in more detail with reference to FIGS. 9 to 18.

FIGS. 9 to 18 are diagrams sequentially illustrating a process of processing a substrate according to the flow chart of FIG. 8.

Figure 9:
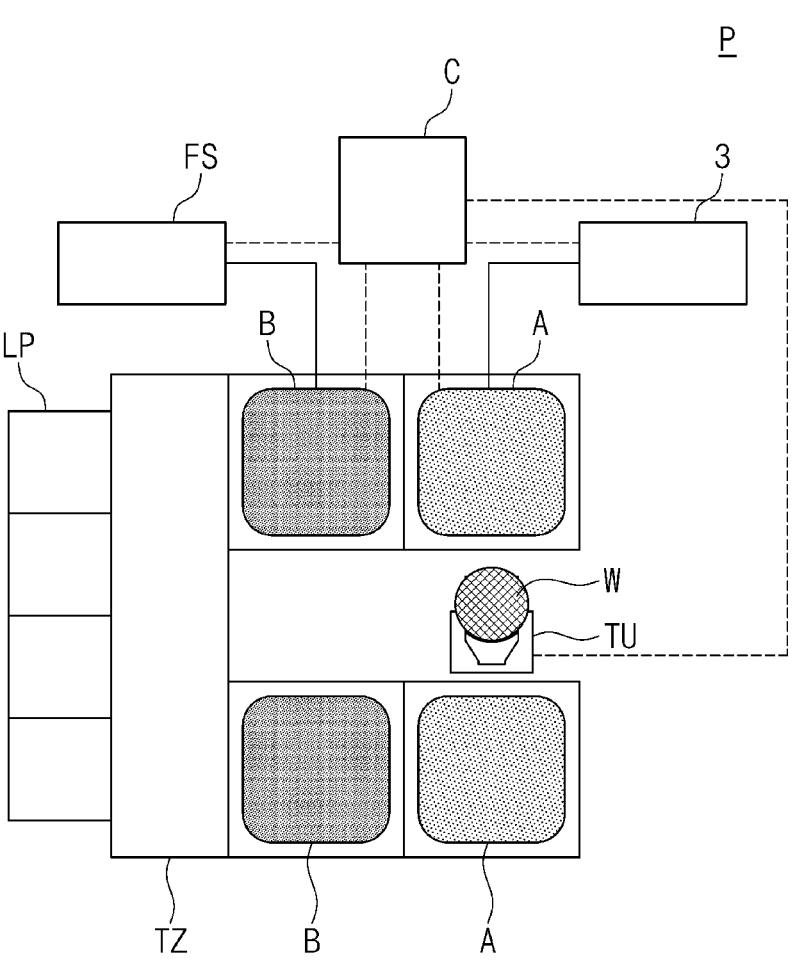
FIGS. 9 to 18 are diagrams sequentially illustrating a process of processing a substrate according to the flow chart of FIG. 8.

Referring to FIGS. 9 and 8, the wet process on the substrate (in S1) may include treating a substrate W, which is placed in the wet chamber B, in a wet manner. For example, in the wet chamber B, the substrate W may be coated with developing solution, IPA, or the like. The substrate W, which is unloaded from the wet chamber B, may have a top surface that is coated with a liquid material. The substrate W may be transferred by the transfer unit TU. The substrate W may be inserted into the drying chamber A by the transfer unit TU.

Figure 10:
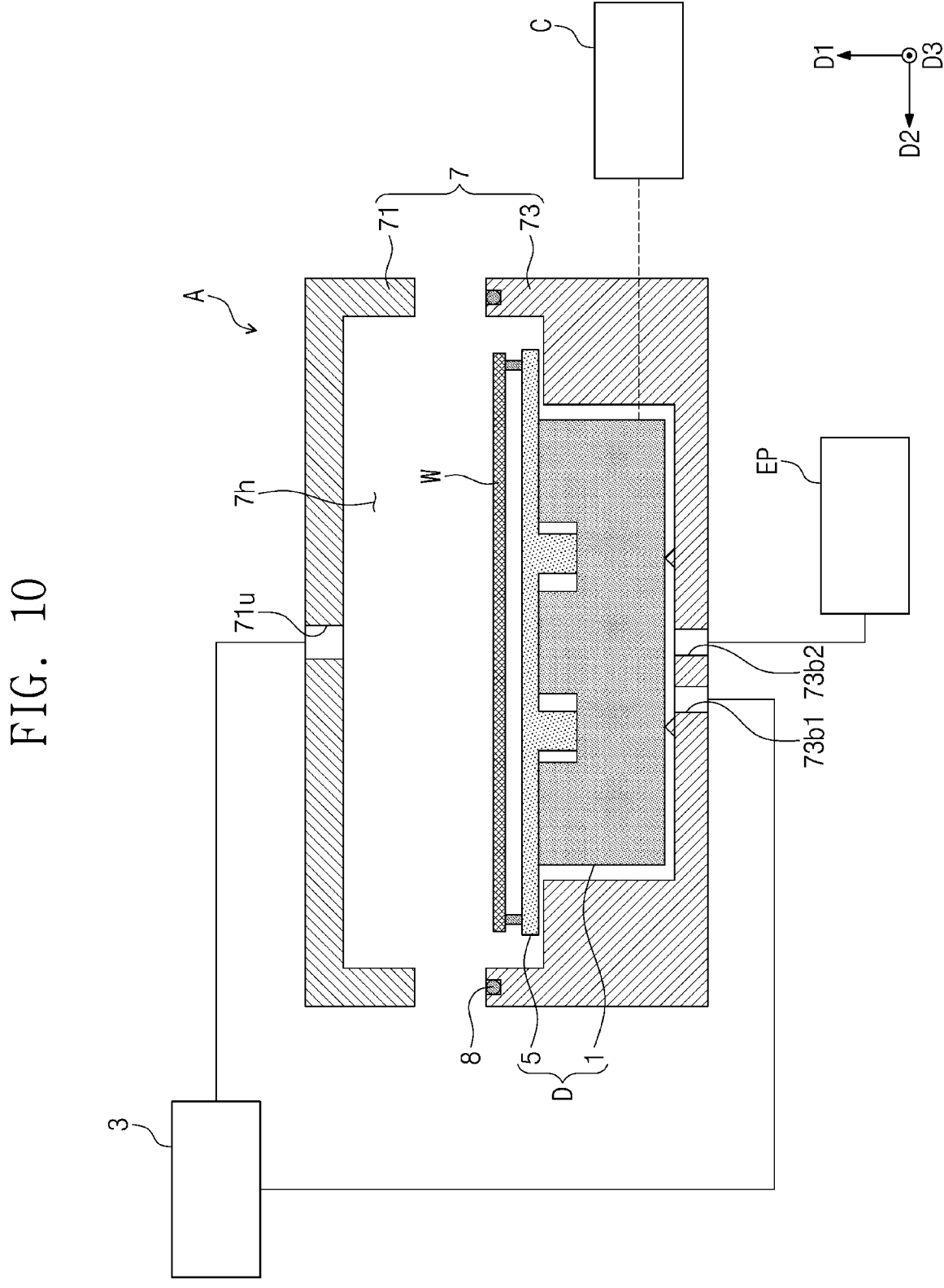

Referring to FIGS. 10 and 8, the placing of the substrate in the drying chamber (in S21) may include placing the substrate W on the spin chuck 5 using the transfer unit TU (e.g., see FIG. 9). Here, the upper chamber 71 may be separated and spaced apart from the lower chamber 73 in the upward direction. The substrate W may be loaded on the supporting pin 515 (e.g., see FIG. 5A).

Figure 11:
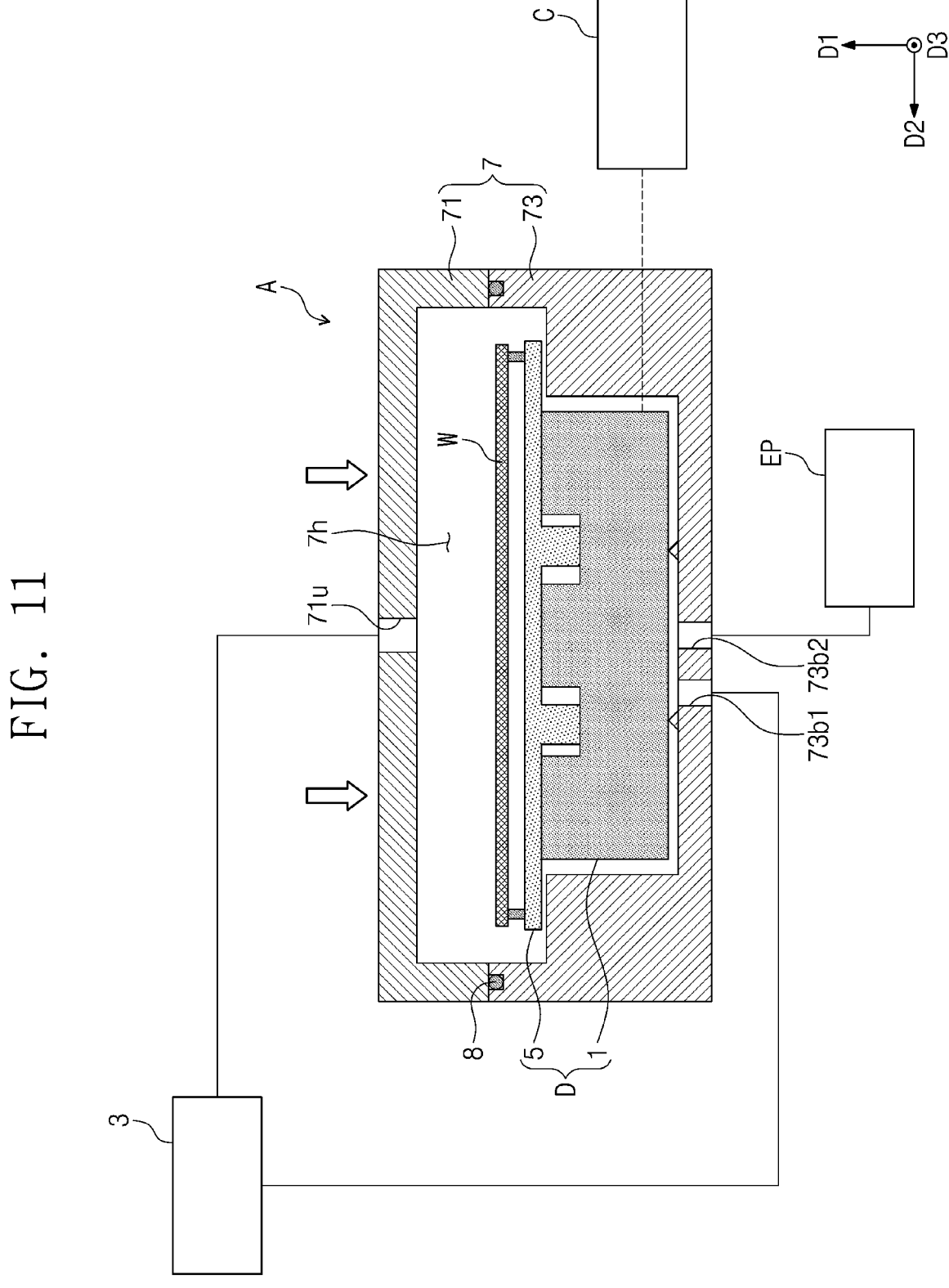
Figure 12:
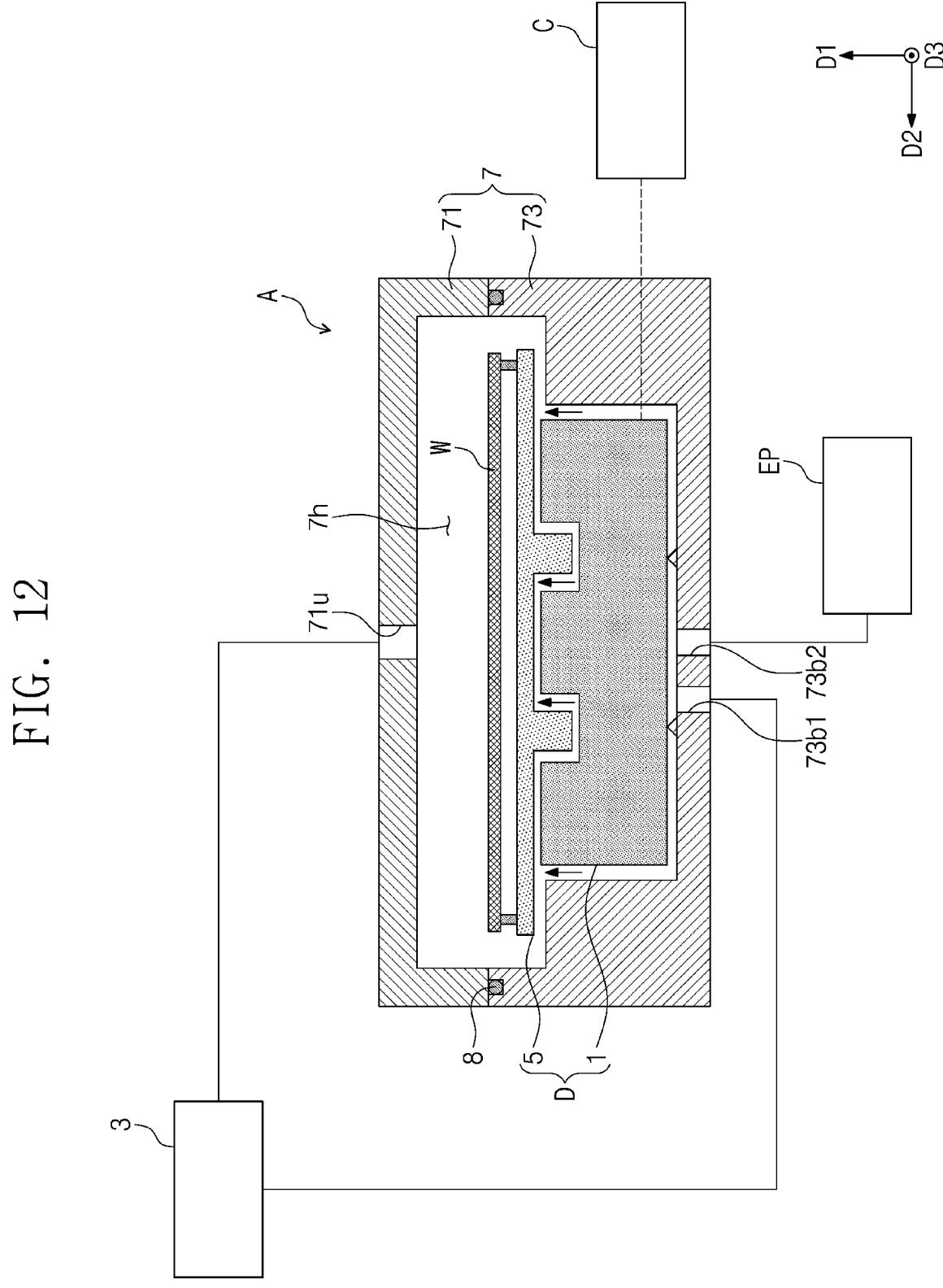

Referring to FIG. 11, the upper and lower chambers 71 and 73 may be coupled to each other. Accordingly, the process space 7h may be isolated from the outside.

Referring to FIGS. 12, 13, 14, and 8, the rotation of the substrate (in S22) may include levitating the spin chuck 5 from the stage 1 in the upward direction and rotating the spin chuck 5. The upward levitation of the spin chuck 5 may be achieved by a magnetic interaction between the first magnetic element 55 and the third magnetic element 151. For example, a repulsive force between the third magnetic element 151 and the first magnetic element 55 may be exerted on the first magnetic element 55 in the upward direction. Accordingly, the entirety of the spin chuck 5 may be levitated upward from the stage 1. The spin chuck 5 may be spaced apart from the stage 1. For example, the spin chuck 5 and the stage 1 may be in a non-contact state. The third magnetic element 151 may be driven by a power supplied from the power supplying part 12. For example, when a current is supplied from the power supplying part 12 to a coil of the third magnetic element 151, the third magnetic element 151 may be used as an electromagnet. As a result, the spin chuck 5 may be levitated in the upward direction. The rotation of the spin chuck 5 may include rotating the levitated spin chuck 5 using rotation of the rotating part 13. The rotating part 13 may be rotated under the control of the inner control unit 14. For example, the rotation driver 135 may be rotated by the power from the power supplying part 12, in response to the control signal from the inner control unit 14. Once the rotation axle 133 is rotated by the rotation driver 135, the second magnetic element 131 may also rotate about the center axis CA. Once the second magnetic element 131 rotates, the first magnetic element 55 may also rotate about the center axis CA. Accordingly, the entirety of the spin chuck 5 may rotate about the center axis CA. Once the spin chuck 5 rotates, the substrate W on the spin chuck 5 may also rotate about the center axis CA. In an embodiment, the control of the inner control unit 14 on the rotation driver 135 may be controlled by the outer control unit C. For example, if the outer control unit C transmits an RF signal, the wireless communication part 17 may receive the RF signal. If the wireless communication part 17 receives the RF signal, the wireless communication part 17 may transmit a control signal to the inner control unit 14. The inner control unit 14 may drive the rotation driver 135, based on the received control signal. However, the inventive concept is not limited to this example, and the inner control unit 14 may control the rotation driver 135, based on a previously-input program, not on a signal transmitted from the outside.

Figure 15:
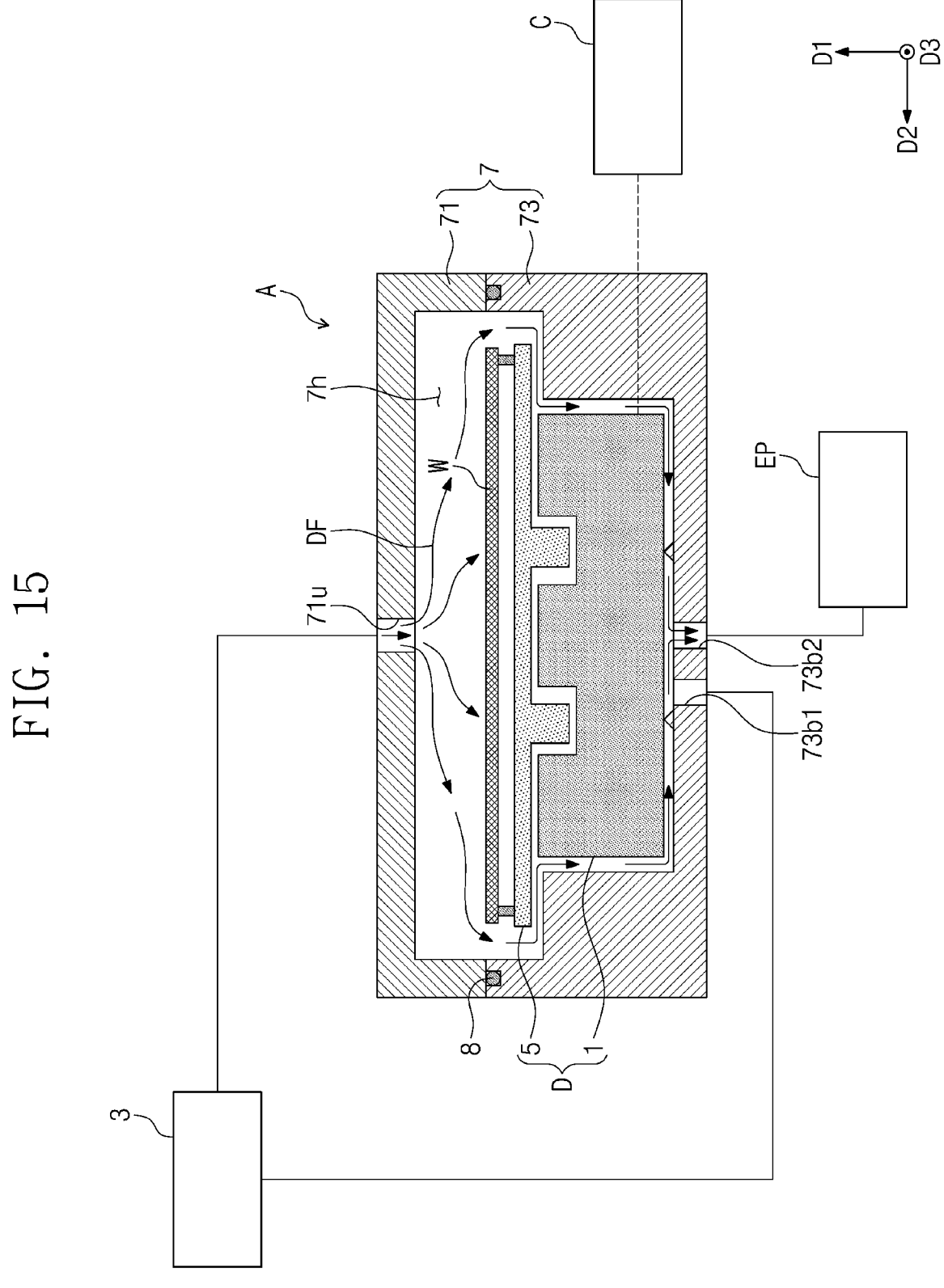

Referring to FIGS. 15 and 8, the supplying of the drying fluid into the drying chamber (in S23) may include supplying a drying fluid DF from the drying fluid supplying part 3 into the process space 7h. The process space 7h may be filled with the drying fluid DF. The pressure of the process space 7h, which is filled with the drying fluid DF, may be increased. For example, at this stage, the process space 7h may be in a high-pressure state.

As described above, the drying fluid DF may be a supercritical fluid. For example, the drying fluid DF may be carbon dioxide ($CO_2$) in a supercritical state. The drying fluid DF, which is supplied in the process space 7h through the upper inflow hole 71u, may be supplied onto a top surface of the substrate W. When the drying fluid DF is supplied, the substrate W may be in a rotating state. Thus, if the drying fluid DF is provided on the top surface of the substrate W, the drying fluid DF may be pushed out to an edge of the substrate W along the top surface of the substrate W by a centrifugal force. Thus, the drying fluid DF may be uniformly spread on the top surface of the substrate W. Since the drying fluid DF in the supercritical state has a small surface tension, fine patterns, which are formed on the top surface of the substrate W, may not be damaged or collapsed. For example, it may be possible to prevent the fine patterns, which are formed on the top surface of the substrate W, from being broken, when the drying fluid DF passes along the top surface of the substrate W by the centrifugal force. During this process, the drying fluid DF may react with the liquid material left on the top surface of the substrate W, and as a result, the liquid material may be removed from the substrate W. Alternatively, the drying fluid DF may push the liquid material, which is left on the top surface of the substrate W, thereby removing the liquid material from the substrate W. The drying fluid DF may be exhausted to the lower outflow hole 73b2 through a space between the stage 1 and the lower chamber 73.

Figure 13:
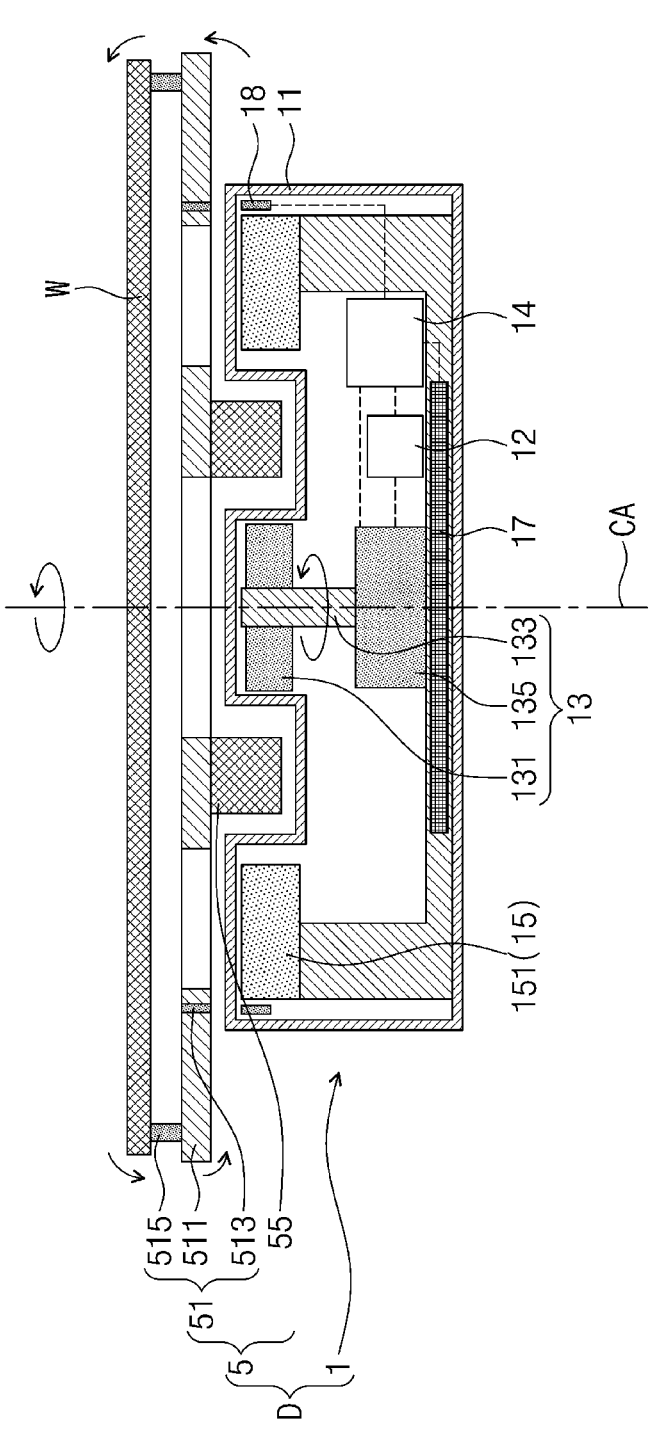
Figure 14:
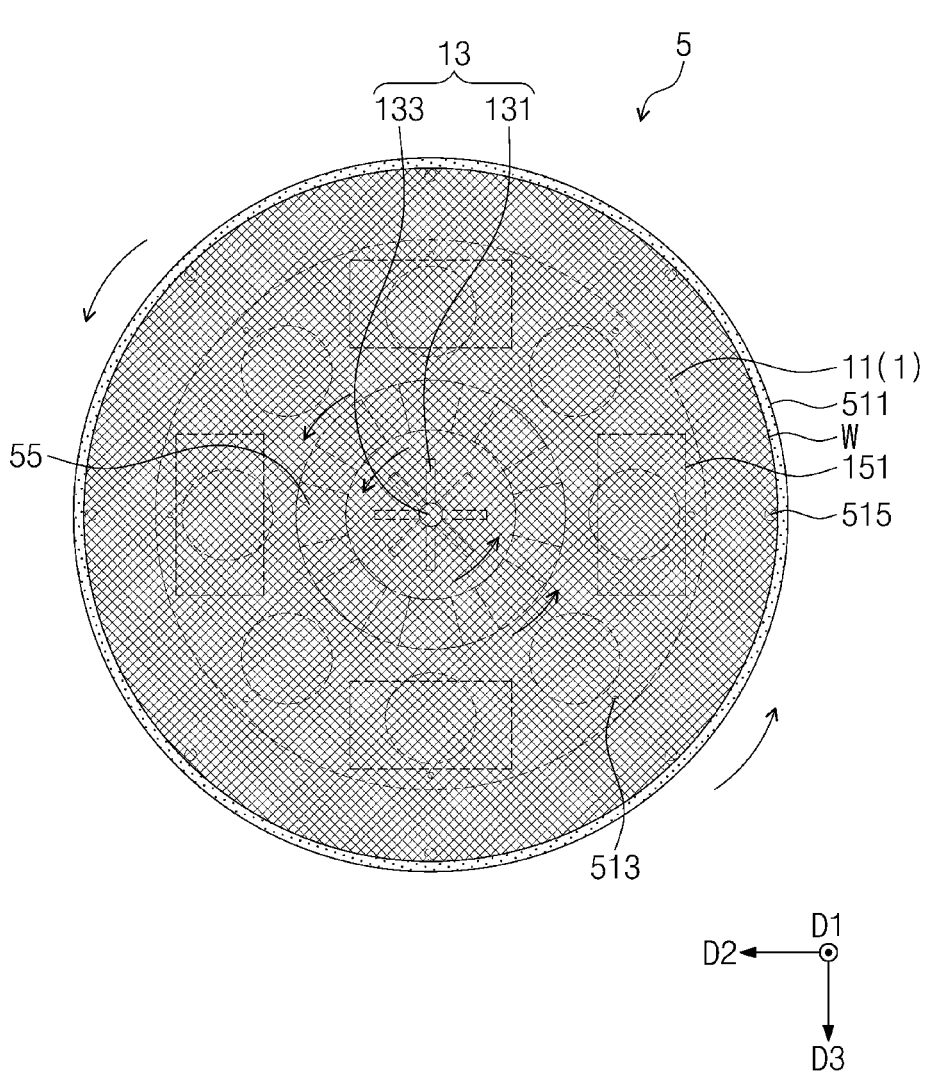
Figure 16:
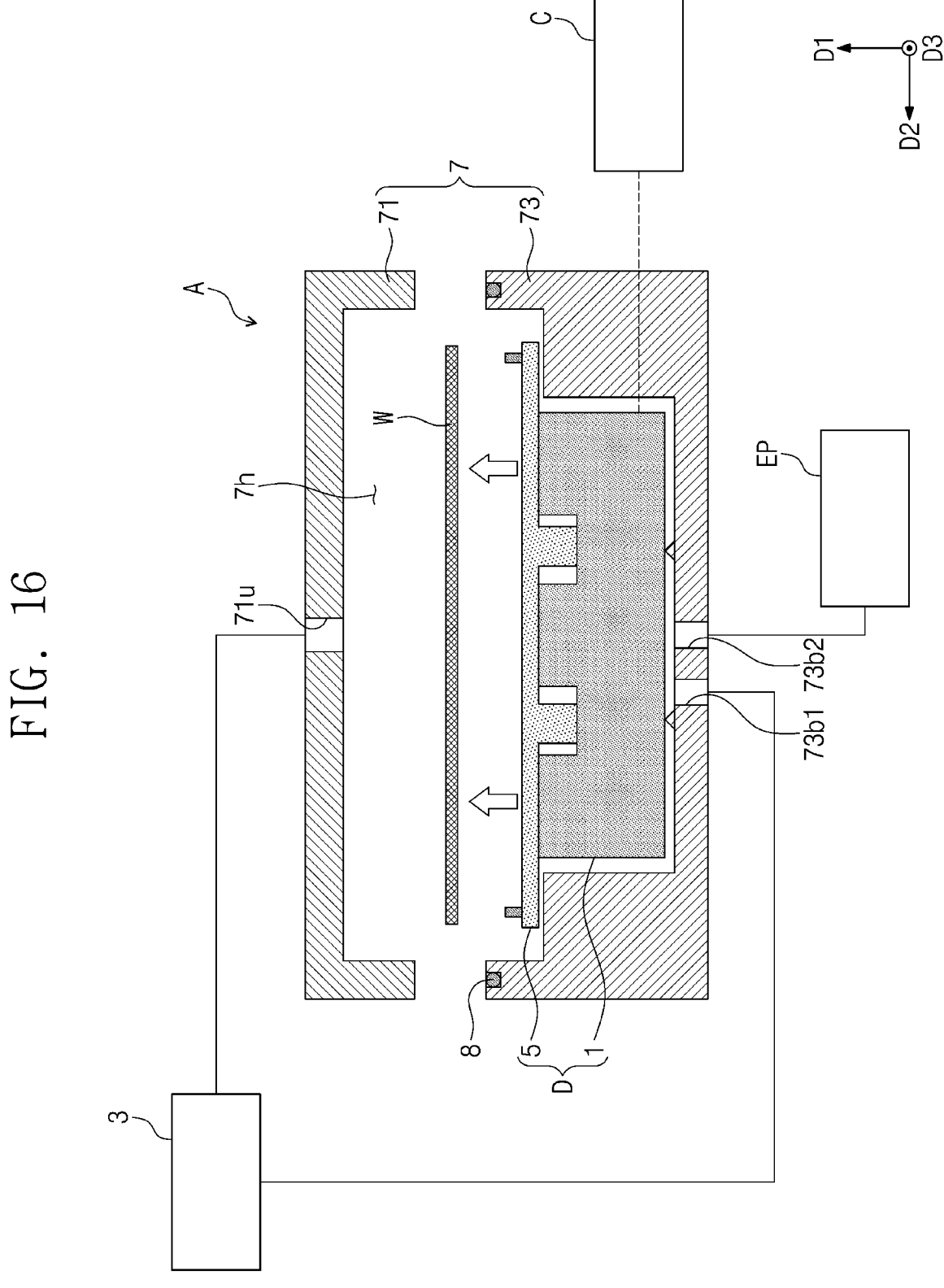

Referring to FIGS. 16, 13, and 8, the unloading of the substrate from the drying chamber (in S24) may include lifting and unloading the substrate W from the spin chuck 5, after the drying process. Here, the first position-monitoring part 18 may be used to examine a position of the second position-monitoring part 513. In the case where the second position-monitoring part 513 is not located at its normal position, the substrate W may be further rotated by the rotation driver 135 under the control of the inner control unit 14. This process may be continued until the second position-monitoring part 513 is placed on the first position-monitoring part 18. The unloading of the substrate W may be performed by the transfer unit TU (e.g., see FIG. 9). To lift up the substrate W, the transfer unit TU may be in contact with a bottom surface of the substrate W. For this, a portion of the transfer unit TU may be inserted into a region between the substrate W and the spin chuck 5. If, after the rotation, the spin chuck 5 is not located at its normal position, the transfer unit TU may collide with the supporting pin 515 during the insertion of the transfer unit TU. According to an embodiment of the inventive concept, by using the first and second position-monitoring parts 18 and 513, it may be possible to rotate the spin chuck 5 such that the spin chuck 5 is placed at its normal position. Thus, it may be possible to prevent the collision between the transfer unit TU and the supporting pin 515. For example, the substrate W may be lifted up by the transfer unit TU and may be unloaded from the drying chamber A.

Figure 17:
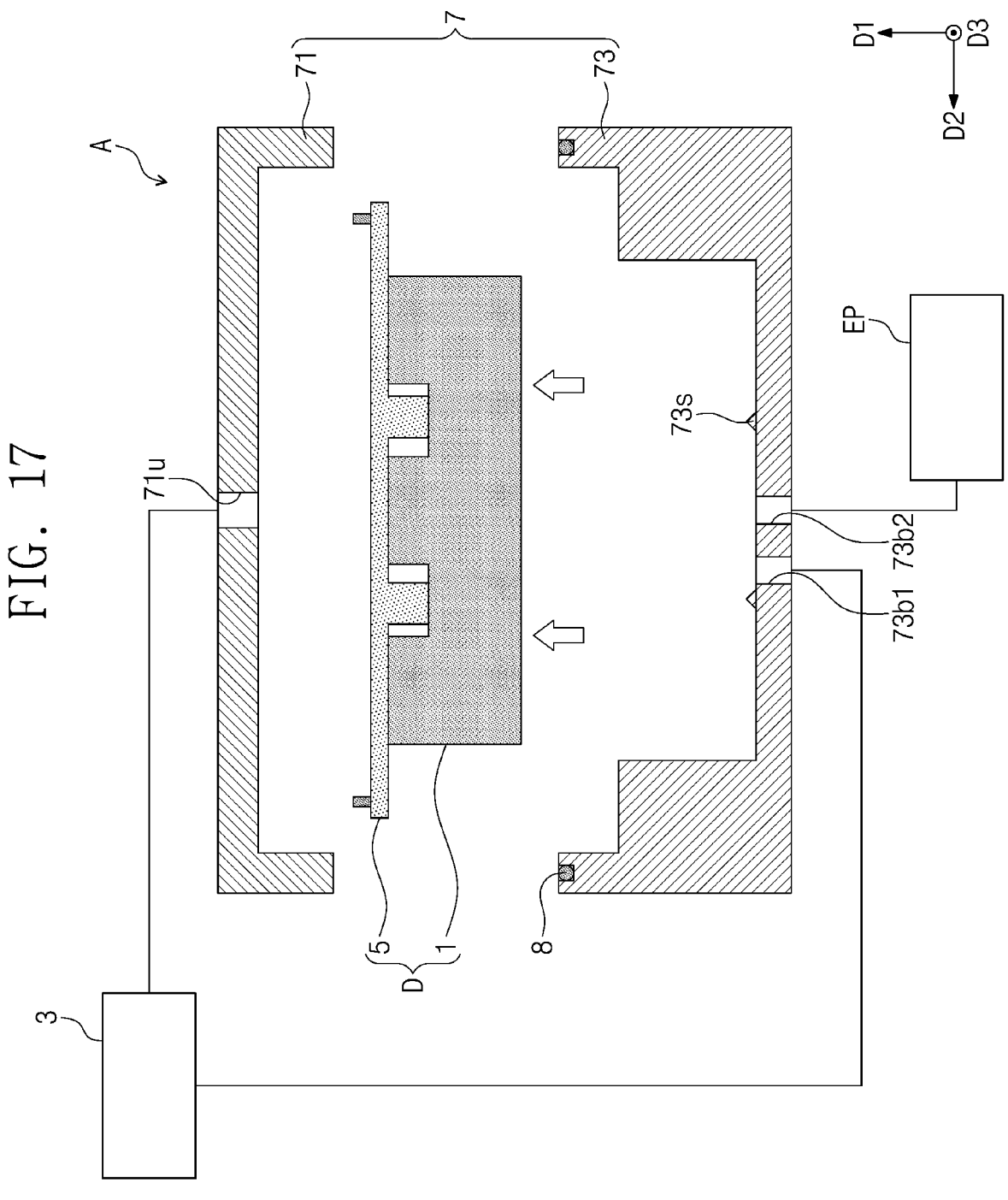

Referring to FIGS. 17 and 8, the charging of the battery (in S25) may include separating the substrate rotating apparatus D from the chamber housing 7. The substrate rotating apparatus D may be lifted up from the stage supporting member 73s. The substrate rotating apparatus D may be unloaded from the chamber housing 7.

Figure 18:
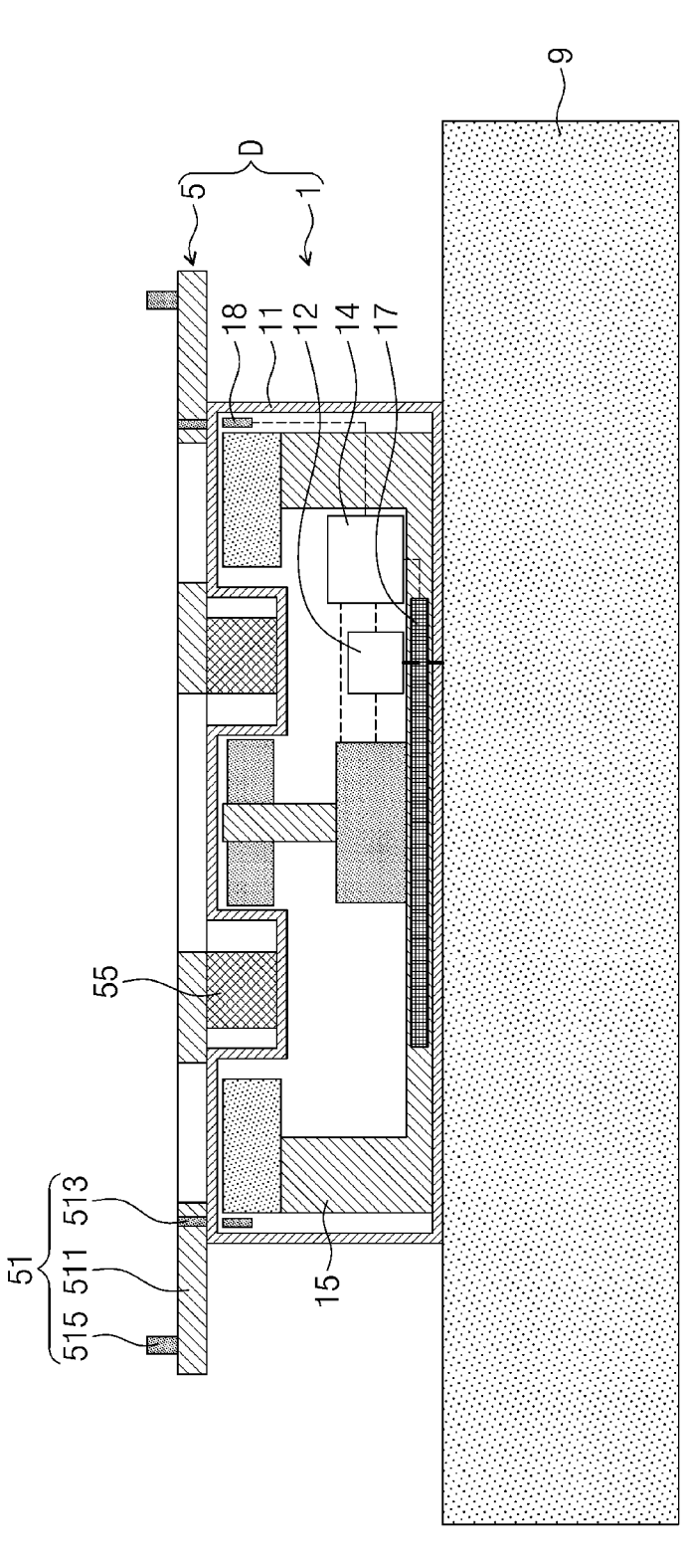

Referring to FIGS. 18 and 5B, the charging of the battery may be performed in a wireless charging manner. In addition, the charging of the battery may be executed outside the drying chamber 7 (e.g., see FIG. 17). For example, the charging of the battery may be performed by the external RF power transmitting part 9. The external RF power transmitting part 9 may be placed outside the drying chamber A. The external RF power transmitting part 9 may be configured to supply an RF power to the wireless charging circuit 123 of the power supplying part 12. For this, the external RF power transmitting part 9 may include an RF transmitter or the like. The wireless charging circuit 123 may be configured to receive the RF power and to charge the battery 121 with the RF power. So far, it has been described that the charging of the battery is performed outside the drying chamber A, but the inventive concept is not limited to this example. For example, the operation of charging the battery in the wireless manner may be performed, when the substrate rotating apparatus D is disposed in the drying chamber A.

In a substrate rotating apparatus, a substrate processing system including the same, and a substrate processing method using the same according to embodiments of the inventive concept, a substrate may be rotated in a drying chamber. Thus, a drying fluid may be uniformly spread on the substrate by a centrifugal force. Even when the drying fluid is asymmetrically supplied in a process space, e.g., on a substrate, in a process of supplying the drying fluid, the drying fluid may be uniformly spread by the rotation of the substrate. Thus, drying and cleaning operations on the top surface of the substrate may be uniformly performed. Accordingly, it may be possible to increase process efficiency and production yield in a fabrication process. In addition, a process of supplying and exhausting the drying fluid may be performed in an increased degree of freedom. For example, since the drying fluid is uniformly spread by the rotation of the substrate, it may not be necessary to strictly meet the symmetry requirement for the substrate in the process of supplying and exhausting the drying fluid. This may make it possible to alleviate difficulties or constraints in designing other components of the drying chamber.

In a substrate rotating apparatus, a substrate processing system including the same, and a substrate processing method using the same according to embodiments of the inventive concept, a spin chuck may rotate on a stage in a non-contact state. Thus, it may be possible to prevent/reduce a particle issue which may occur in a rotation step. If particles are produced, the substrate may be contaminated by the particles. According to an embodiment of the inventive concept, since the rotation of the spin chuck is performed without friction with the stage, it may be possible to reduce/prevent the particle issue and the consequent contamination of the substrate from being occurring.

In a substrate rotating apparatus, a substrate processing system including the same, and a substrate processing method using the same according to embodiments of the inventive concept, an inner control unit, a battery, and a wireless communication part may be provided in a substrate rotating apparatus. Thus, it may be possible to rotate the substrate rotating apparatus, even when the stage is not connected to the outside in a wired manner. In addition, since the battery is charged in a wireless manner, it may be unnecessary to place an additional terminal, which is used to charge the battery, on a surface of the stage. Accordingly, the entire surface of the stage may be provided in a fully-coated state. For example, an internal element in the stage may not be exposed to the outside. Thus, even when the drying chamber is filled with a high-pressure drying fluid, it may be possible to prevent fluid and particle from being infiltrate into the stage. Since the fluid is prevented from being infiltrated into the stage, it may be possible to prevent the substrate rotating apparatus from being damaged. Thus, it may be possible to improve the durability and life time of the system and its components.

In a substrate rotating apparatus, a substrate processing system including the same, and a substrate processing method using the same according to embodiments of the inventive concept, only the spin chuck, not the stage housing, may be configured to rotate. Thus, it may be possible to save a power for the rotation. In addition, the spin chuck may be provided to have a penetration hole, and in this case, it may be possible to reduce a weight of the spin chuck. Accordingly, it may be possible to reduce a power for the rotation. Moreover, since it is unnecessary to rotate the stage, it may be unnecessary to place a stage supporting member, which is used to support the stage, on a center axis. Thus, a lower outflow hole may be formed to pass through a center of a lower chamber. This may make it possible to realize symmetric distribution of the drying fluid. The symmetric distribution of the drying fluid may enhance uniformity of the process which may be beneficial for quality of devices formed on a substrate.

Figure 19:
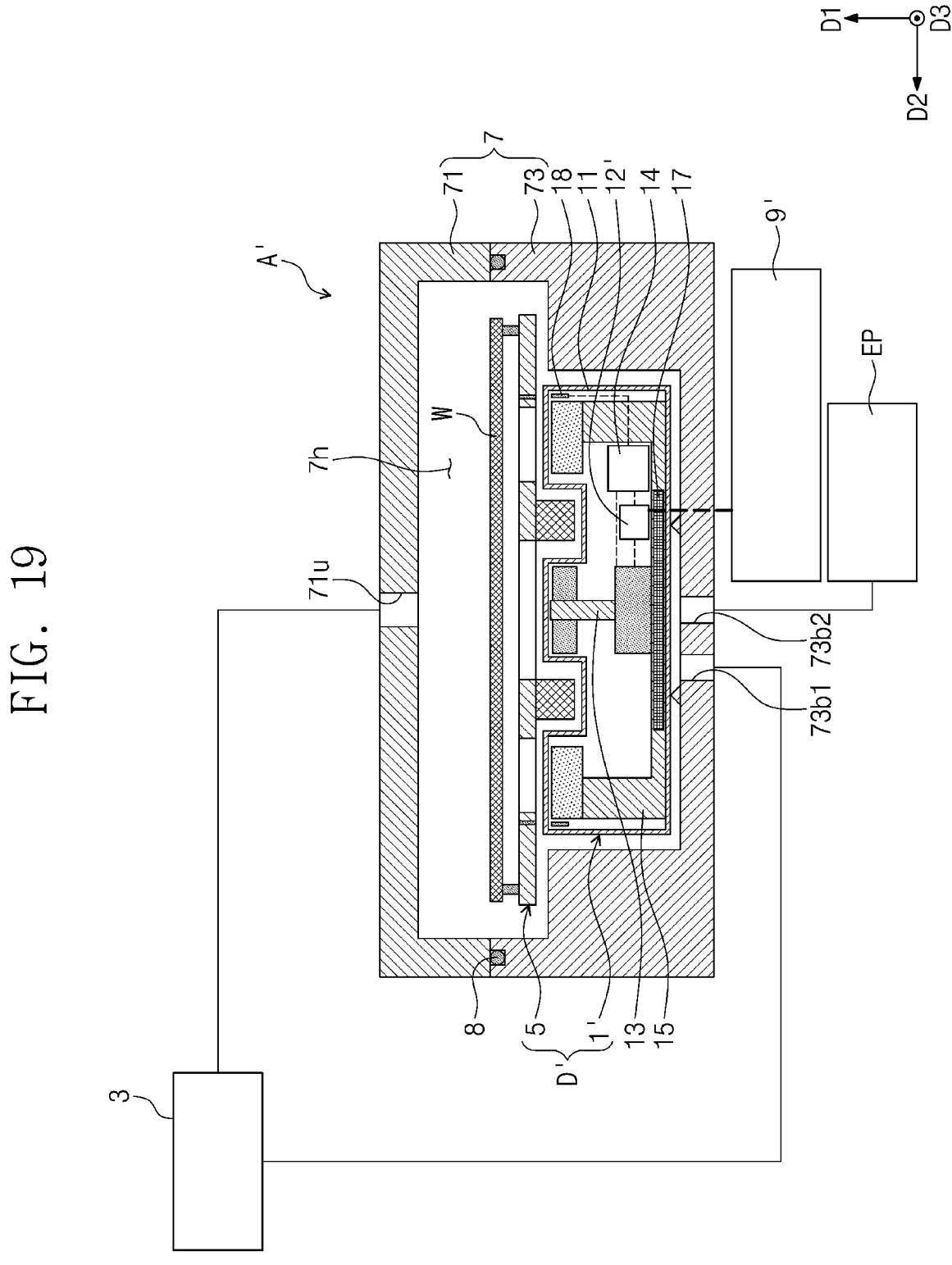
FIG. 19 is a sectional view illustrating a drying chamber according to an embodiment of the inventive concept.

FIG. 19 is a sectional view illustrating a drying chamber according to an embodiment of the inventive concept.

For concise description, an element previously described with reference to FIGS. 1 to 18 may be identified by the same reference number without repeating an overlapping description thereof.

Referring to FIG. 19, a drying chamber A' may be provided. However, unlike the drying chamber A described with reference to FIG. 2, a power from the outside may be supplied to the drying chamber A' of FIG. 19, during an operation of the substrate rotating apparatus D'. For example, an RF signal may be transmitted to a power supplying part 12', which is used to supply the power to the rotating part 13, by a real-time external RF power transmitting part 9'. Thus, in order to charge the battery when the process is finished, it may be unnecessary to unload a stage 1' from the chamber housing 7. In this case, the capacity of the battery 121 (e.g., see FIG. 5B) may also be reduced. Accordingly, it may be possible to reduce a volume and cost of the battery 121. Alternatively, the battery 121 may be omitted, and the power may be directly supplied from the wireless charging circuit 123 (e.g., see FIG. 5B) to the rotating part 13.

Figure 20:
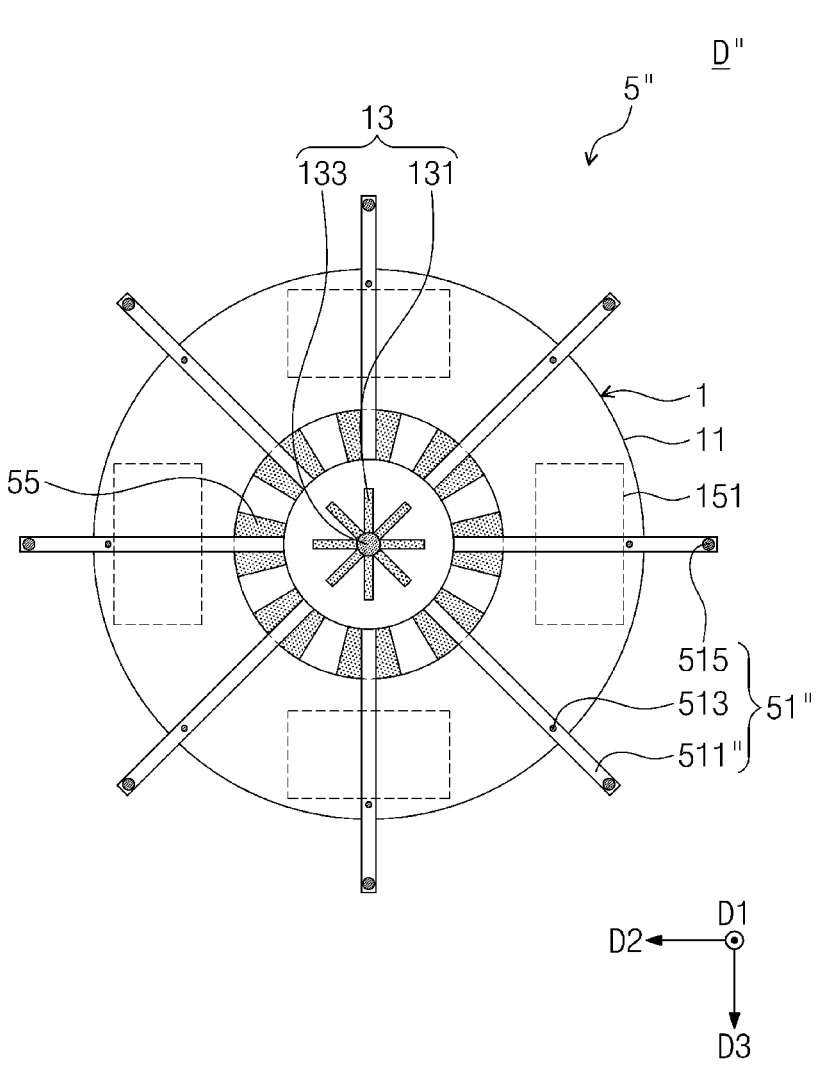
FIG. 20 is a plan view illustrating a substrate rotating apparatus according to an embodiment of the inventive concept.

FIG. 20 is a plan view illustrating a substrate rotating apparatus according to an embodiment of the inventive concept.

For concise description, elements previously described with reference to FIGS. 1 to 19 may be identified by the same reference numbers without repeating overlapping descriptions thereof.

Referring to FIG. 20, a substrate rotating apparatus D" may be provided. However, unlike the substrate rotating apparatus D described with reference to FIG. 6, a substrate supporting member 51" of the substrate rotating apparatus D" of FIG. 20 may include a supporting bar 511". The supporting bar 511" may extend in a radial direction and may have a specific length. The supporting pin 515 and the second position-monitoring part 513 may be coupled to the supporting bar 511". A plurality of supporting bars 511" may be provided in the substrate rotating apparatus D". For example, the plurality of supporting bars 511" may extend in radial directions. The supporting bars 511" may be spaced apart from each other in a circumferential direction. The substrate may be supported by the supporting bars 511". According to the present embodiment, it may be possible to reduce a weight of a spin chuck 5". Thus, it may be possible to reduce a power required to rotate the spin chuck 5".

Figure 21:
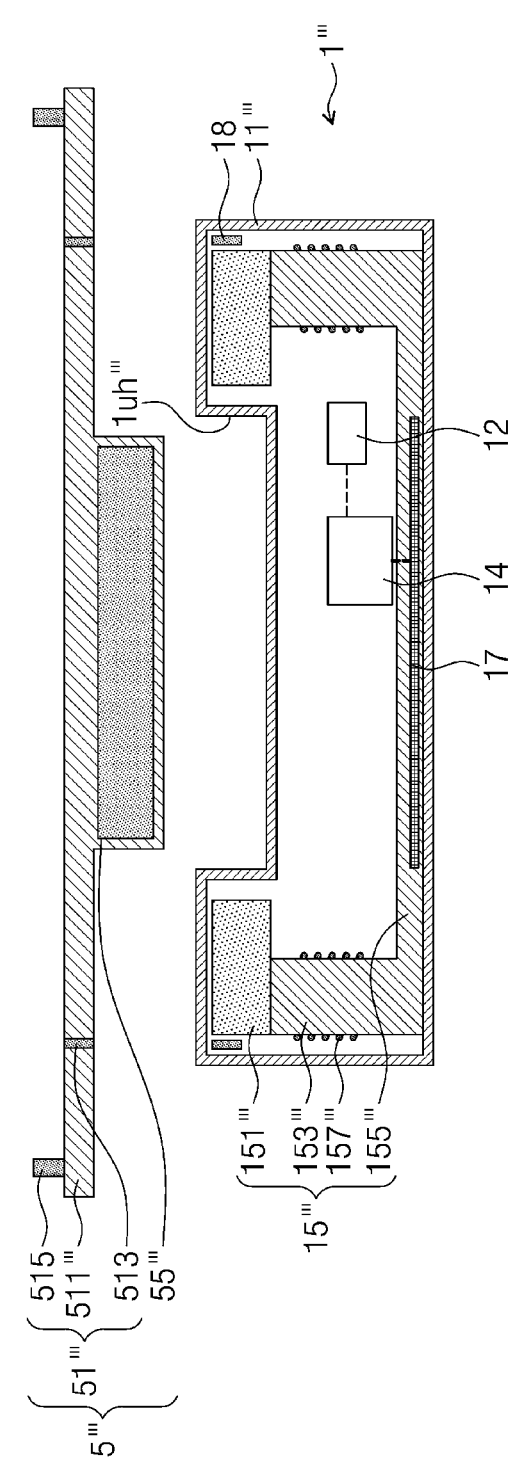
FIG. 21 is a sectional view illustrating a substrate rotating apparatus according to an embodiment of the inventive concept.

FIG. 21 is a sectional view illustrating a substrate rotating apparatus according to an embodiment of the inventive concept.

For concise description, elements previously described with reference to FIGS. 1 to 20 may be identified by the same reference numbers without repeating overlapping descriptions thereof.

Referring to FIG. 21, a substrate rotating apparatus D''' may be provided. However, for the substrate rotating apparatus D''' of FIG. 21, the rotating part may not be provided in the stage 1''', unlike the substrate rotating apparatus D described with reference to FIG. 5A. A fastening part 15''' may include coil cores 151''', 153''', and 155''' and a coil 157'''. Due to the coil 157''', an upper coil core 151''' may be used to levitate and rotate a first magnetic element 55'''. For example, if a current is applied to the coil 157''' by the power supplying part 12 and the inner control unit 14, the first magnetic element 55''' may be levitated and rotated by the upper coil core 151'''.

In a substrate rotating apparatus, a substrate processing system including the same, and a substrate processing method using the same according to embodiments of the inventive concept, it may be possible to rotate a substrate in a high-pressure chamber.

In a substrate rotating apparatus, a substrate processing system including the same, and a substrate processing method using the same according to an embodiment of the inventive concept, it may be possible to hermetically seal elements for rotation under high-pressure environment.

In a substrate rotating apparatus, a substrate processing system including the same, and a substrate processing method using the same according to embodiments of the inventive concept, it may be possible to improve efficiency in a process of drying a substrate.

In a substrate rotating apparatus, a substrate processing system including the same, and a substrate processing method using the same according to embodiments of the inventive concept, it may be possible to prevent a substrate from being contaminated.

While example embodiments of the inventive concept have been particularly shown and described, it will be understood by one of ordinary skill in the art that variations in form and detail may be made therein without departing from the spirit and scope of the attached claims.

What is claimed is:

1. A substrate rotating apparatus, comprising:

a spin chuck configured to support a substrate; and a stage positioned underneath the spin chuck, the stage being configured to rotate the spin chuck about an axis parallel to a first direction, wherein the spin chuck comprises:

a first magnetic element; and a substrate supporting member provided on the first magnetic element, wherein the stage comprises:

a stage housing;

a rotating part configured to rotate about the axis parallel to the first direction;

an inner control unit configured to control rotation of the rotating part;

a power supplying part configured to supply a power to the rotating part; and a wireless communication part configured to receive a control signal from an outside and configured to transmit the control signal to the inner control unit, wherein the rotating part comprises:

a second magnetic element spaced apart from the first magnetic element; and a rotation driver configured to rotate the second magnetic element, wherein the rotating part, the inner control unit, the power supplying part, and the wireless communication part are hermetically sealed within the stage housing.

2. The substrate rotating apparatus of claim 1, wherein the stage further comprises a fastening part spaced apart from the rotating part, wherein the fastening part comprises:

a third magnetic element configured to levitate the first magnetic element; and an inner supporting member supporting the third magnetic element, wherein the third magnetic element is placed outside the second magnetic element.

3. The substrate rotating apparatus of claim 1, wherein the power supplying part comprises:

a battery; and a wireless charging circuit configured to receive a radio frequency (RF) power, which is transmitted from an outside, and configured to charge the battery using the RF power.

4. The substrate rotating apparatus of claim 1, wherein the spin chuck comprises a plurality of first magnetic elements and the rotating part comprises a plurality of second magnetic elements, the plurality of first magnetic elements are arranged to be spaced apart from each other in a circumferential direction, and the plurality of second magnetic elements are arranged in a region inside the plurality of first magnetic elements and are spaced apart from each other in the circumferential direction.

5. The substrate rotating apparatus of claim 1, wherein the substrate supporting member comprises:

a supporting plate; and a supporting pin on the supporting plate, wherein the supporting plate has a plurality of penetration holes.

6. The substrate rotating apparatus of claim 1, wherein the substrate supporting member comprises:

a plurality of supporting bars extending in radial directions; and a plurality of supporting pins on the supporting bars, wherein the plurality of supporting bars are arranged to be spaced apart from each other in a circumferential direction.

7. The substrate rotating apparatus of claim 1, wherein the stage further comprises a first position-monitoring part, and the substrate supporting member comprises a second position-monitoring part that is located at a position corresponding to the first position-monitoring part.

8. The substrate rotating apparatus of claim 1, wherein a surface of the stage housing is coated with polytetrafluoroethylene (PTFE).

9. The substrate rotating apparatus of claim 1, wherein the wireless communication part comprises:

a wireless receiver configured to receive an RF signal from an outside and configured to transmit the RF signal to the inner control unit; and a wireless transmitter configured to transmit an RF signal to the outside.

10. A substrate processing system, comprising:

a drying chamber configured to be used to dry a substrate; and a drying fluid supplying part configured to supply a drying fluid to the drying chamber, wherein the drying chamber comprises:

a chamber housing provided to have a process space; and a substrate rotating apparatus disposed in the chamber housing, wherein the substrate rotating apparatus comprises:

a stage; and a spin chuck configured to support the substrate and configured to be levitated upward from the stage to rotate in a non-contact state with the stage, wherein the stage is positioned underneath the spin chuck and is configured to rotate the spin chuck about an axis parallel to a first direction, wherein the spin chuck comprises:

a first magnetic element; and a substrate supporting member provided on the first magnetic element, wherein the stage comprises:

a stage housing;

a rotating part configured to rotate about the parallel to the first direction;

an inner control unit configured to control rotation of the rotating part;

a power supplying part configured to supply a power to the rotating part; and a wireless communication part configured to receive a control signal from an outside and to transmit the received control signal to the inner control unit, wherein the rotating part comprises:

a second magnetic element spaced apart from the first magnetic element; and a rotation driver configured to rotate t de second magnetic element and wherein the rotating part, the inner control unit, the power supplying part, and the wireless communication part are hermetically sealed within the stage housing.

11. The substrate processing system of claim 10, wherein the chamber housing comprises:

a lower chamber provided to have a lower space; and an upper chamber provided to have an upper space, wherein the upper chamber is selectively combined to the lower chamber,

the process space is formed by connecting the lower space to the upper space, the lower chamber comprises a stage supporting member, which is configured to be in contact with a bottom surface of the stage housing and to support the stage, and the stage supporting member is laterally spaced apart from a center of the stage.

12. The substrate processing system of claim 10, wherein the stage further comprises a fastening part, and wherein the fastening part comprises:

a coil core provided outside the first magnetic element; and a coil enclosing the coil core.

13. The substrate processing system of claim 10, wherein the power supplying part comprises:

a battery; and a wireless charging circuit configured to receive an RF power from an outside and to charge the battery with the RF power.

14. The substrate processing system of claim 10, further comprising:

a wet chamber; and a fluid supplying part configured to supply a process fluid into the wet chamber, wherein the drying chamber is configured to be used to perform a drying process on a substrate unloaded from the wet chamber.

15. The substrate processing system of claim 10, further comprising an outer control unit, wherein the outer control unit is configured to transmit the control signal to the inner control unit through the wireless communication part.

16. A substrate processing method, comprising:

disposing a substrate in a drying chamber;

rotating the substrate; and supplying a drying fluid into the drying chamber, wherein the disposing of the substrate in the drying chamber comprises placing the substrate on a spin chuck of a substrate rotating apparatus, the spin chuck comprising a first magnetic element and a substrate supporting member provided on the first magnetic element,

wherein the rotating of the substrate comprises:

levitating the spin chuck from a stage positioned the spin chuck, the stage being configured to pin chu about an axis parallel to a first direction; and rotating the spin chuck using the stage, wherein the stage comprises:

a stage housing;

a rotating part configured to rotate about the axis parallel to the first direction;

an inner control configured to control rotation of the rotating part;

a power supplying part configured to supply a power to the rotating part; and a wireless communication part configured to receive a control signal from an outside and configured to transmit the control signal to the inner control unit, wherein the rotating part comprises:

a second magnetic element spaced apart from the first magnetic element; and a rotation driver configured to rotate the second magnetic element, wherein the rotating of the spin chuck comprises rotating the spin chuck using the power, which is supplied from the power supplying part placed in the stage housing to rotate the second magnet element of the rotating part, and wherein the rotating part, the inner control unit, the power supplying part, and the wireless communication part are hermetically sealed within the stage housing.

17. The substrate processing method of claim 16, wherein the power supplying part comprises a battery and a wireless charging circuit.

18. The substrate processing method of claim 17, further comprising charging the battery, wherein the charging of the battery comprises:

supplying an RF power to the wireless charging circuit using an external RF power transmitting part; and charging the battery using the wireless charging circuit.

19. The substrate processing method of claim 18, further comprising unloading the substrate rotating apparatus from the drying chamber, when a drying process on the substrate is finished, wherein the charging of the battery is performed outside the drying chamber.

* * * * *